(12) United States Patent
Chuang et al.

(10) Patent No.: US 11,508,877 B2
(45) Date of Patent: Nov. 22, 2022

(54) RED LIGHT EMITTING DIODE AND MANUFACTURING METHOD THEREOF

(71) Applicant: Genesis Photonics Inc., Tainan (TW)

(72) Inventors: Tung-Lin Chuang, Tainan (TW); Yi-Ru Huang, Tainan (TW); Yu-Chen Kuo, Tainan (TW); Chih-Ming Shen, Tainan (TW); Tsung-Syun Huang, Tainan (TW); Jing-En Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 107 days.

(21) Appl. No.: 16/826,298

(22) Filed: Mar. 23, 2020

(65) Prior Publication Data

US 2020/0357955 A1 Nov. 12, 2020

Related U.S. Application Data

(60) Provisional application No. 62/822,070, filed on Mar. 22, 2019.

(51) Int. Cl.
*H01L 33/38* (2010.01)
*H01L 33/62* (2010.01)
(Continued)

(52) U.S. Cl.
CPC ........ *H01L 33/382* (2013.01); *H01L 33/0095* (2013.01); *H01L 33/10* (2013.01);
(Continued)

(58) Field of Classification Search
CPC ... H01L 33/382; H01L 33/0095; H01L 33/10; H01L 33/42; H01L 33/62;
(Continued)

(56) References Cited

U.S. PATENT DOCUMENTS 9,871,169 B2 1/2018 Huang et al.
9,985,151 B2 * 5/2018 Hoeppel ............... H01L 33/382
(Continued)

FOREIGN PATENT DOCUMENTS

CN 102074622 5/2011
CN 103053036 4/2013
(Continued)

OTHER PUBLICATIONS

Yi-Ru Huang et al., "Light Emitting Diode and Manufacturing Method Thereof", U.S. Appl. No. 16/792,312, filed Feb. 17, 2020.
(Continued)

*Primary Examiner* — Su C Kim
(74) *Attorney, Agent, or Firm* — JCIPRNET

(57) ABSTRACT

A red light emitting diode including an epitaxial stacked layer, a first and a second electrodes and a first and a second electrode pads is provided. The epitaxial stacked layer includes a first-type and a second-type semiconductor layers and a light emitting layer. A main light emitting wavelength of the light emitting layer falls in a red light range. The epitaxial stacked layer has a first side adjacent to the first semiconductor layer and a second side adjacent to the second semiconductor layer. The first and the second electrodes are respectively electrically connected to the first-type and the second-type semiconductor layers, and respectively located to the first and the second sides. The first and a second electrode pads are respectively disposed on the first and the second electrodes and respectively electrically connected to the first and the second electrodes. The first and the second electrode pads are located at the first side of the epitaxial stacked layer. Furthermore, a manufacturing method of the red light emitting diode is also provided.

17 Claims, 37 Drawing Sheets

(51) Int. Cl.
  *H01L 33/42* (2010.01)
  *H01L 33/00* (2010.01)
  *H01L 33/10* (2010.01)

(52) U.S. Cl.
  CPC .............. *H01L 33/42* (2013.01); *H01L 33/62* (2013.01); *H01L 2933/0016* (2013.01); *H01L 2933/0066* (2013.01)

(58) Field of Classification Search
  CPC ..... H01L 2933/0016; H01L 2933/0066; H01L 33/387; H01L 33/46; H01L 33/385; H01L 33/48; H01L 33/005; H01L 33/647
  See application file for complete search history.

(56) References Cited

U.S. PATENT DOCUMENTS

| | | | |
|---|---|---|---|
| 10,038,121 | B2 | 7/2018 | Huang et al. |
| 10,453,999 | B2 | 10/2019 | Huang et al. |
| 2002/0036295 | A1 | 3/2002 | Nunoue et al. |
| 2012/0025244 | A1 | 2/2012 | Suh et al. |
| 2012/0070920 | A1* | 3/2012 | Shimonishi ........... H01L 24/743 438/26 |
| 2012/0074441 | A1 | 3/2012 | Seo et al. |
| 2014/0377459 | A1 | 12/2014 | Kawashima |
| 2015/0076547 | A1 | 3/2015 | Totani et al. |
| 2016/0163923 | A1 | 6/2016 | Kuo et al. |
| 2017/0256520 | A1* | 9/2017 | Moon ................ H01L 25/0753 |
| 2017/0294566 | A1* | 10/2017 | Hsieh ................ H01L 33/0062 |
| 2018/0130926 | A1 | 5/2018 | Huang et al. |

FOREIGN PATENT DOCUMENTS

| | | |
|---|---|---|
| CN | 104103722 | 10/2014 |
| CN | 203932092 | 11/2014 |
| CN | 204088355 | 1/2015 |
| CN | 105637658 | 6/2016 |
| CN | 105895775 | 8/2016 |
| JP | 2011061127 | 3/2011 |
| TW | 201013973 | 4/2010 |
| TW | 201216532 | 4/2012 |
| TW | 201415534 | 4/2014 |
| WO | 2015053595 | 4/2015 |

OTHER PUBLICATIONS

"Office Action of Taiwan Related Application, Application No. 109143102", dated Jul. 9, 2021, p. 1-p. 4.
"Office Action of China Related Application, application No. 201910386672.3", dated Jul. 3, 2020, p. 1-p. 6.
"Office Action of China Related Application, application No. 202010832795.8", dated Apr. 30, 2021, p. 1-p. 6.
"Office Action of Taiwan Related Application, application No. 109103720", dated May 11, 2021, p. 1-p. 3.
"Office Action of China Related Application, application No. 201910765017.9", dated Nov. 23, 2021, p. 1-p. 7.
"Office Action of U.S. Appl. No. 1 6/792,312", dated Oct. 26, 2021, pp. 1-40.
"Office Action of China Related Application, Application No. 202010313803.8", dated Sep. 17, 2021, p. 1-p. 6.

* cited by examiner

RED LIGHT EMITTING DIODE AND MANUFACTURING METHOD THEREOF

CROSS-REFERENCE TO RELATED APPLICATION

This application claims the priority benefit of U.S. provisional application Ser. No. 62/822,070, filed on Mar. 22, 2019. The entirety of the above-mentioned patent application is hereby incorporated by reference herein and made a part of this specification.

BACKGROUND

Technical Field

The disclosure relates to a light emitting diode and a manufacturing method thereof, and in particular, to a red light emitting diode and a manufacturing method thereof.

Description of Related Art

Light emitting diodes are widely applied to different fields thanks to their favorable photoelectric properties. Moreover, light emitting diodes are regarded as the mainstream of the next-generation display technology in recent years owing to low costs and good display effects provided by the light emitting diodes.

Generally, light emitting diodes of red light, blue light, green light, etc. are disposed in each pixel in a light emitting diode display most of the time, and the structure of an existing red light emitting diode is usually a vertical light emitting diode. When an existing red light emitting diode is to be applied to a light emitting diode display, the electrode of one end thereof is bonded to the array substrate, and the other end is required to be bonded into the wire-bonding region of the light emitting diode display through a wire-bonding manner. Arrangement of the wire-bonding region prevents the volume of the light emitting diode display from being effectively reduced, and applicability of the red light emitting diode is thereby considerably limited.

SUMMARY

The disclosure provides a red light emitting diode exhibiting favorable applicability.

The disclosure provides a manufacturing method of manufacturing the red light emitting diode.

An embodiment of the disclosure provides a red light emitting diode including an epitaxial stacked layer, a first electrode, a second electrode, a first electrode pad, and a second electrode pad. The epitaxial stacked layer includes a first-type semiconductor layer, a second-type semiconductor layer, and a light emitting layer located between the first-type semiconductor layer and the second-type semiconductor layer. A main light emitting wavelength of the light emitting layer falls in a red light range. The epitaxial stacked layer includes a first side and a second side opposite to each other. The first side is adjacent to the first-type semiconductor layer, and the second side is adjacent to the second-type semiconductor layer. The first electrode is electrically connected to the first-type semiconductor layer and is located at the first side of the epitaxial stacked layer. The second electrode is electrically connected to the second-type semiconductor layer and is located at the second side of the epitaxial stacked layer. The first electrode pad is disposed on the first electrode and is electrically connected to the first electrode. The second electrode pad is disposed on the second electrode and is electrically connected to the second electrode. The first electrode pad and the second electrode pad are located at the first side of the epitaxial stacked layer.

In an embodiment of the disclosure, the red light emitting diode further includes a reflective stacked layer. The reflective stacked layer includes a first insulating layer, a second insulating layer, and a reflective layer and is disposed at the first side of the epitaxial stacked layer. The reflective layer is disposed between the first insulating layer and the second insulating layer. The first insulating layer covers the epitaxial stacked layer and is located between the reflective layer and the epitaxial stacked layer. The first insulating layer has a plurality of first vias, and the first vias expose the first electrode and the second electrode. The second insulating layer covers the reflective layer and has a plurality of second vias. The reflective layer has a plurality of third vias. The first electrode pad and the second electrode pad are electrically connected to the first electrode and the second electrode respectively through the first vias, the second vias, and the third vias.

In an embodiment of the disclosure, the red light emitting diode further includes a buffer stacked layer, a first current conducting layer, and a second current conducting layer. The buffer stacked layer is located between the epitaxial stacked layer and the buffer stacked layer. The buffer stacked layer includes a third insulating layer, a fourth insulating layer, and a buffer layer, and the buffer layer is sandwiched between the third insulating layer and the fourth insulating layer. The third insulating layer covers the buffer layer. The third insulating layer has a plurality of fourth vias, the buffer layer has a plurality of fifth vias, and the fourth insulating layer has a plurality of sixth vias. The first current conducting layer is disposed between the reflective stacked layer and the buffer stacked layer. The second current conducting layer is disposed between the reflective stacked layer and the buffer stacked layer. The first current conducting layer and the second current conducting layer are electrically connected to the first electrode and the second electrode respectively through the first vias, the second vias, and the third vias, and the first electrode pad and the second electrode pad are electrically connected to the first current conducting layer and the second current conducting layer respectively through the fourth vias, the fifth vias, and the sixth vias.

In an embodiment of the disclosure, at least one of the first electrode and the second electrode has a soldering portion and at least one finger portion extending from the soldering portion. The reflective layer and the soldering portion of the first electrode or the second electrode are disposed in a misaligned manner, and the finger portion of the first electrode or the second electrode and the reflective layer are disposed in an overlapping manner.

In an embodiment of the disclosure, the red light emitting diode further includes a carrying substrate, a bonding layer, and a lower insulating layer. The carrying substrate has an upper surface. The bonding layer is disposed on the upper surface. The lower insulating layer is disposed on the upper surface, and the bonding layer is located between the carrying substrate and the lower insulating layer. The epitaxial stacked layer, the first electrode, the second electrode, the first electrode pad, and the second electrode pad are located on the lower insulating layer.

In an embodiment of the disclosure, side surfaces of the carrying substrate, the bonding layer, and the lower insulating layer form an inclined surface.

In an embodiment of the disclosure, the red light emitting diode further includes an upper insulating layer having a plurality of seventh vias. The first electrode, the second electrode, and the epitaxial stacked layer are located between the upper insulating layer and the lower insulating layer, and the first electrode pad and the second electrode pad are electrically connected to the first electrode and the second electrode respectively through the seventh vias.

In an embodiment of the disclosure, the red light emitting diode further includes a reflective layer disposed on the upper surface. The reflective layer is located between the lower insulating layer and the bonding layer.

In an embodiment of the disclosure, the red light emitting diode further includes a semiconductor layer located between the first electrode and the first-type semiconductor layer. The first electrode is electrically connected to the first-type semiconductor layer through the semiconductor layer.

In an embodiment of the disclosure, the red light emitting diode further includes a conductive structure layer disposed at the second side and located between the second-type semiconductor layer and the second electrode.

In an embodiment of the disclosure, the conductive structure layer includes a transparent conductive layer and a plurality of ohmic metal structures. the ohmic metal structures are located between the transparent conductive layer and the second-type semiconductor layer, a gap is provided between adjacent two ohmic metal structures, and the transparent conductive layer covers the ohmic metal structures.

In an embodiment of the disclosure, the conductive structure layer includes a transparent conductive layer.

An embodiment of the disclosure provides a manufacturing method of a red light emitting diode and includes the following steps. An epitaxial stacked layer is formed. The epitaxial stacked layer includes a first-type semiconductor layer, a second-type semiconductor layer, and a light emitting layer located between the first-type semiconductor layer and the second-type semiconductor layer. A main light emitting wavelength of the light emitting layer falls in a red light range. Herein, the epitaxial stacked layer has a first side and a second side opposite to each other, the first side is adjacent to the first-type semiconductor layer, and the second side is adjacent to the second-type semiconductor layer. A first electrode and a second electrode are respectively formed on the first side and the second side of the epitaxial stacked layer, and the first electrode and the second electrode are electrically connected to the first-type semiconductor layer and the second-type semiconductor layer of the epitaxial stacked layer respectively. A first electrode pad and a second electrode pad are formed on the first side of the epitaxial stacked layer, and the first electrode pad and the second electrode pad are electrically connected to the first electrode and the second electrode respectively.

In an embodiment of the disclosure, the step of forming the reflective stacked layer further includes the follow steps. The first insulating layer is formed on the epitaxial stacked layer, the first electrode, and the second electrode, parts of the first insulating layer is etched to form a plurality of first vias, and the first vias expose parts of the first electrode and the second electrode. The reflective layer is formed on the first insulating layer and parts of the reflective layer are etched to form a plurality of third vias, and the third vias respectively align with the first vias. The second insulating layer is formed on the reflective layer and parts of the second insulating layer are etched to form a plurality of second vias, and the second vias respectively align with the third vias.

In an embodiment of the disclosure, the step of forming the first electrode pad and the second electrode pad on the first side of the epitaxial stacked layer further includes the following step. The first vias, the second vias, and the third vias are filled with the first electrode pad and the second electrode pad, so that the first electrode pad and the second electrode pad are electrically connected to the first electrode and the second electrode respectively.

In an embodiment of the disclosure, in step of forming the buffer stacked layer on the epitaxial stacked layer, the buffer stacked layer includes a third insulating layer, a buffer layer, and a fourth insulating layer. The buffer layer is located between the third insulating layer and the fourth insulating layer.

In an embodiment of the disclosure, the step of forming the buffer stacked layer further includes the following steps. The third insulating layer is formed on the epitaxial stacked layer, the first electrode, and the second electrode and parts of the third insulating layer are etched to form a plurality of fourth vias. The fourth vias expose parts of the first current conducting layer and the second current conducting layer. The buffer layer is formed on the third insulating layer and parts of the buffer layer are etched to form a plurality of fifth vias. The fifth vias respectively align with the fourth vias. The fourth insulating layer is formed on the buffer layer and parts of the fourth insulating layer are etched to form a plurality of sixth vias. The sixth vias respectively align with the fifth vias.

In an embodiment of the disclosure, the step of forming the first electrode pad and the second electrode pad on the first side of the epitaxial stacked layer further includes the following step. The first vias, the second vias, and the third vias are filled with the first electrode pad and the second electrode pad, so that the first electrode pad and the second electrode pad are electrically connected to the first electrode and the second electrode respectively.

In an embodiment of the disclosure, the manufacturing method of the red light emitting diode further includes the following steps. A first current conducting layer and a second current conducting layer are formed on the third insulating layer, and the first vias, the second vias, and the third vias are filled with the first current conducting layer and the second current conducting layer, so that the first current conducting layer and the second current conducting layer are electrically connected to the first electrode and the second electrode respectively.

In an embodiment of the disclosure, the manufacturing method of the red light emitting diode further includes the following step: a buffer stacked layer is formed on the epitaxial stacked layer. The buffer stacked layer includes a third insulating layer, a buffer layer, and a fourth insulating layer. The buffer layer is located between the third insulating layer and the fourth insulating layer.

In an embodiment of the disclosure, the step of forming the buffer stacked layer further includes the following steps. The third insulating layer is formed on the epitaxial stacked layer, the first electrode, and the second electrode and parts of the third insulating layer are etched to form a plurality of fourth vias. The fourth vias expose parts of the first current conducting layer and the second current conducting layer. The buffer layer is formed on the third insulating layer and parts of the buffer layer are etched to form a plurality of fifth vias. The fifth vias respectively align with the fourth vias. The fourth insulating layer is formed on the buffer layer and parts of the fourth insulating layer are etched to form a plurality of sixth vias. The sixth vias respectively align with the fifth vias.

In an embodiment of the disclosure, the step of forming the first electrode pad and the second electrode pad on the first side of the epitaxial stacked layer further includes the following step. The fourth vias, the fifth vias, and the sixth vias are filled with the first electrode pad and the second electrode pad, so that the first electrode pad and the second electrode pad are electrically connected to the first current conducting layer and the second current conducting layer respectively.

In an embodiment of the disclosure, the red light emitting diode further includes a carrying substrate disposed at the second side of the epitaxial stacked layer and a bonding layer and is disposed at the second side of the epitaxial stacked layer. The carrying substrate has an upper surface. The bonding layer is disposed on the upper surface. The first electrode pad and the second electrode pad are disposed at the first side of the epitaxial stacked layer or the side corresponding to the carrying substrate, so that the first electrode pad and the second electrode pad may be electrically connected to an external substrate (e.g., an array substrate of a display) in a flip-chip manner through an eutectic or a soldering process.

To sum up, since the red light emitting diode in the embodiments of the disclosure is provided in a form of a flip-chip light emitting diode, the red light emitting diode may be electrically connected to an external substrate (e.g., an array substrate of a display) in a flip-chip manner through the two electrode pads by an eutectic process. In this way, arrangement of a wire-bonding region may be omitted, so that a volume of a light emitting diode device (e.g., a light emitting diode display) may be effectively reduced, and favorable applicability is thereby provided. Besides, since the red light emitting diode is a flip-chip light emitting diode, heat dissipation may be performed through the internal first and second electrodes and the first and the second electrode pads to dissipate heat to the outside, and that heat dissipation efficiency is improved. In addition, the manufacturing method of manufacturing the red light emitting diode is also provided in the disclosure.

DESCRIPTION OF THE EMBODIMENTS

Figure 1A:
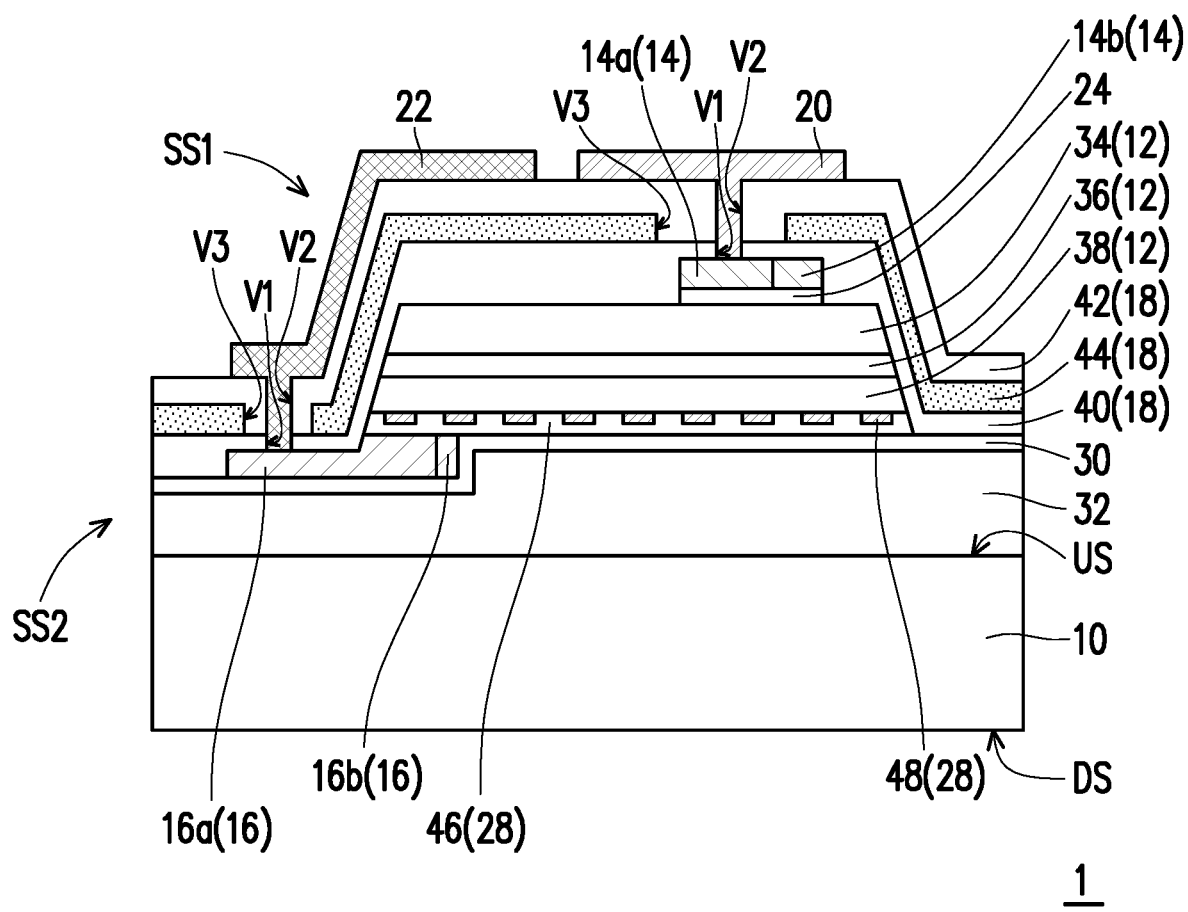
FIG. 1A is a schematic cross-sectional view of a red light emitting diode according to an embodiment of the disclosure.
Figure 1B:
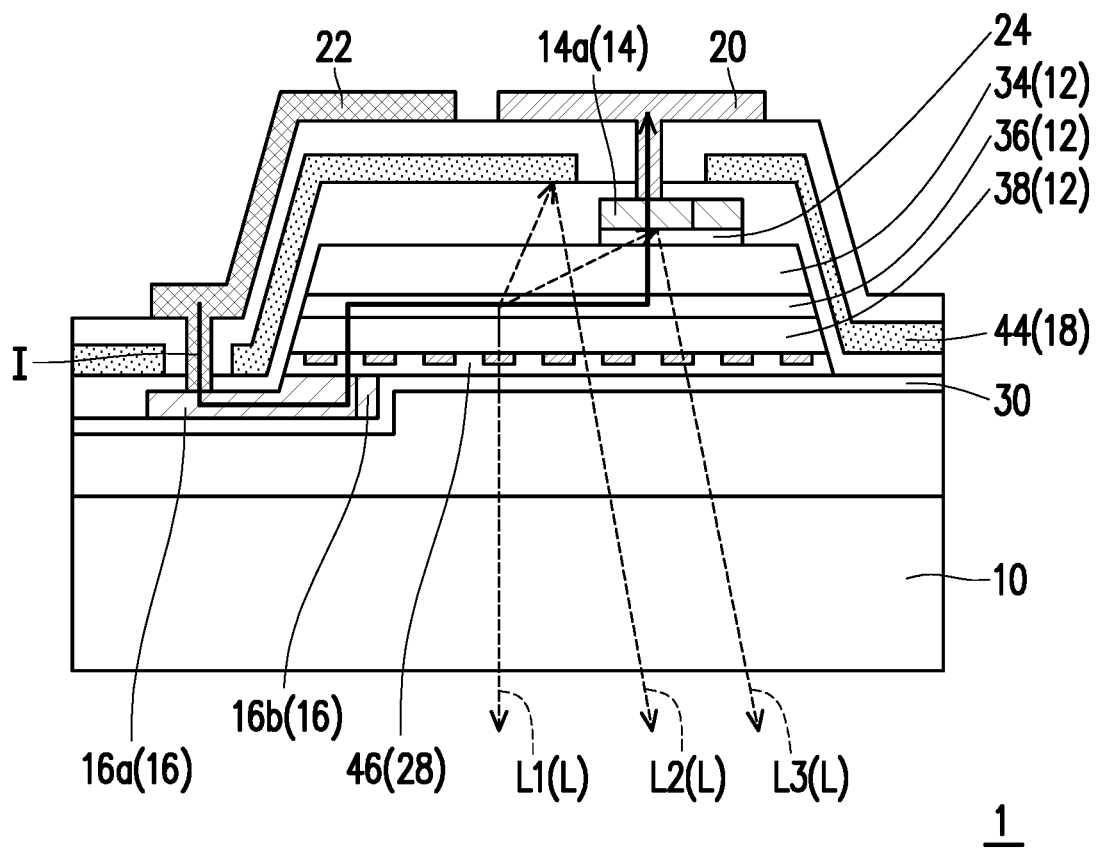
FIG. 1B is schematic diagram of a current path and an optical effect of the red light emitting diode in FIG. 1A.

FIG. 1A is a schematic cross-sectional view of a red light emitting diode according to an embodiment of the disclosure. FIG. 1B is schematic diagram of a current path and an optical effect of the red light emitting diode in FIG. 1A.

With reference to FIG. 1A, a red light emitting diode 1 includes a substrate 10, an epitaxial stacked layer 12, a first electrode 14, a second electrode 16, a reflective stacked layer 18, a first electrode pad 20, a second electrode pad 22, a semiconductor layer 24, a conductive structure layer 28, a lower insulating layer 30, and a bonding layer 32. The foregoing devices are described in detail in the following paragraphs.

The substrate 10 is mainly configured carry the above-mentioned elements and may also be called as a carrying substrate. The substrate 10 has an upper and a lower surfaces US and DS opposite to each other, and a material thereof may include a sapphire substrate, a glass substrate, or a transparent substrate.

The epitaxial stacked layer 12 includes a first-type semiconductor layer 34, a light emitting layer 36, and a second-type semiconductor layer 38, the light emitting layer 36 is located between the first- and the second-type semiconductor layers 34 and 36, and a cross section of the epitaxial stacked layer 12 is generally trapezoid-shaped, but is not limited thereto.

In detail, the first-type and the second-type semiconductor layers 34 and 38 have opposite electrical properties. Specifically, a material of the first-type semiconductor layer 34 includes N-type aluminium gallium indium phosphide (AlGaInP), but is not limited thereto. A material of the light emitting layer 36 includes AlGaInP, but is not limited thereto. A material of the second-type semiconductor layer 38 includes gallium phosphide (GaP), but is not limited thereto. A main light emitting wavelength of the light emitting layer 36 falls in a red light range, and the red light range falls from 600 nanometers to 780 nanometers. The main light emitting wavelength is the wavelength corresponding to the greatest light intensity in the light intensity spectrum of the red light emitting diode 1. The structure of the light emitting layer 36 is, for example, a multiple quantum well (MQW) layer formed by a plurality of well layers and a plurality of barrier layers stacked in an alternating manner or is a single quantum well (SQW) layer, but is not limited thereto.

A material of the first and the second electrodes 14 and 16 includes chromium (Cr), aluminum (Al), silver (Ag), platinum (Pt), titanium (Ti), nickel (Ni), gold (Au), aluminum-copper alloy (Al/Cu), gold-germanium alloy (AuGe), gold-beryllium alloy (AuBe), gold alloy, aluminum alloy, or a combination of the foregoing materials, but is not limited thereto. The first electrode 14 has a soldering portion 14a and a finger portion 14b extending from the soldering portion 14a, and the second electrode 16 has a soldering portion 16a and a finger portion 16b extending from the soldering portion 16a. Note that in this embodiment, each of the two electrodes 14 and 16 has a soldering portion and a finger portion, but in other embodiments, only one electrode is designed to have a solder portion and a finger portion, and the disclosure is not limited thereto.

The reflective stacked layer 18 is a function stacked layer providing a reflective function and includes a first and a second insulating layers 40 and 42 and a reflective layer 44, and the reflective layer 44 is disposed between the first and the second insulating layers 40 and 42. A material of the first and the second insulating layers 40 and 42 includes silicon dioxide ($SiO_2$) or titanium dioxide ($TiO_2$). In this embodiment, the reflective layer 44 may include a distribute Bragg reflector (DBR), an oxide stacked layer, a metal layer, or a combination of two of the foregoing stacking together. The distribute Bragg reflector is an optical stacked layer having multiple high and low refractive index layers stacked in a periodic arrangement manner. A material of the high and low refractive index layers may be, for example, silicon dioxide ($SiO_2$), titanium dioxide, or thallium pentoxide ($Ta_2O_5$), and a material of the metal layer may be, for example, chromium (Cr), aluminum (Al), silver (Ag), platinum (Pt), titanium (Ti), nickel (Ni), gold (Au), aluminum-copper alloy (Al/Cu), gold-germanium alloy (AuGe), gold-beryllium alloy (AuBe), gold alloy, aluminum alloy, or a combination of the foregoing materials, but is not limited thereto. In this embodiment, a material of the reflective layer 44 is a metal material and is, for example, electrically floating, that is, does not participate in the conductive path inside the red light emitting diode 1.

A material of the first and the second electrode pads 20 and 22 includes aluminum, silver, platinum, titanium, nickel, gold, bismuth (Bi), tin (Sn), 0aluminum-copper alloy (Al/Cu), gold-germanium alloy (AuGe), gold-beryllium alloy (AuBe), gold alloy, aluminum alloy, gold-tin alloy (AuSn), tin-silver-copper alloy (Sn/Ag/Cu, SAC), or a combination of the foregoing materials, but is not limited thereto.

Electrical properties of the semiconductor layer 24 and the first-type semiconductor layer 34 are the same, that is, both are N-type, for example, and a material thereof is gallium arsenide or gallium arsenide compounds having a high N-type impurity doping concentration, but is not limited thereto.

The conductive structure layer 28 includes a transparent conductive layer 46 and a plurality of ohmic metal structures 48, the transparent conductive layer 46 covers the ohmic metal structures 48, and a gap d is provided between two adjacent ohmic metal structures. In this embodiment, a material of the transparent conductive layer 46 includes indium tin oxide (OTO), and a material of the ohmic metal structures 48 may be gold, gold alloy, gold-beryllium alloy (AuBe), or gold-germanium alloy (AuGe), but is not limited thereto. In other embodiments that are not shown, the conductive structure layer 28 may include only one single layer of the transparent conductive layer, but the disclosure is not limited thereto.

A material of the lower insulating layer 30 is similar to that of the first and the second insulating layers 40 and 42, and description thereof is not repeated herein. Besides, the lower insulating layer 30 is located below the epitaxial stacked layer 12 and is thus called as the lower insulating layer.

The bonding layer 32 is configured to bond the substrate 10 and the lower insulating layer 30 together, and a material thereof includes an organic adhesive material, glue, silicone, spin on glass (SOG, i.e., liquid silicon dioxide), benzocyclobutene (BCB), gold, copper, tungsten (W), or tin-silver-copper alloy, but is not limited thereto.

Arrangement relationships of the foregoing are described in detail in the following paragraphs. In order to describe the arrangement relationships of the foregoing devices, the epitaxial stacked layer 12 is defined to have a first and a second sides SS1 and SS2 opposite to each other first, the first side SS1 is adjacent to the first-type semiconductor layer 34, and the second side SS2 is adjacent to the second-type semiconductor layer 36.

With reference to FIG. 1 again, based on the position of the epitaxial stacked layer 12, generally, the reflective stacked layer 18, the first electrode 14, the first and the second electrode pads 20 and 22, and the semiconductor layer 24 are located at the first side SS1 of the epitaxial stacked layer 12. On the other hand, the carrying substrate 10, the bonding layer 32, the lower insulating layer 30, and the second electrode 16 are located at the second side SS2.

From the first side SS1 of the epitaxial stacked layer 12, the first electrode 14 and the first-type semiconductor layer 34 are electrically connected. In detail, the semiconductor layer 24 is disposed between the first electrode 14 and the first-type semiconductor layer 34, and the first electrode 14 is electrically connected to the first electrode 14 through the semiconductor layer 24. The first insulating layer 40, the reflective layer 44, and the second insulating layer 46 of the reflective stacked layer 18 are stacked on the epitaxial stacked layer 12 in sequence, and the reflective stacked layer 18 covers a top surface and a side surface of the epitaxial stacked layer 12. The first insulating layer 40 has a plurality of vias V1 (also called as first vias), the second insulating layer 42 has a plurality of vias V2 (also called as second vias), and the reflective layer 44 has a plurality of vias V3 (also called as third vias) as well. Herein, apertures of the vias V1 and the vias V2 are substantially identical, and an aperture of the vias V3 is greater than that of any one of vias V1 and V2. In the first insulating layer 40, parts of the vias V1 (one is schematically shown) expose the soldering portion 14a of the first electrode 14, and other parts of the vias V1 (one is schematically shown) exposes the soldering portion 16a of the second electrode 16. In this embodiment, parts of the vias V1, V2, and V3 overlap with the first electrode 14, and other parts of the vias V1, V2, and V3 overlap with the second electrode 16. The first electrode pad 20 is electrically connected to the first electrode 14 through filling the vias V1 to V3. The second electrode pad 22 is electrically connected to the second electrode 16 through filling the vias V1 to V3. The red light emitting diode 1 may be electrically connected to two connection pads of an external substrate (not shown) of a light emitting diode device through the first and the second electrode pads 20 and 22 in a flip-chip and eutectic manner, and the light emitting diode device may be, for example, a light emitting diode display, but is not limited thereto.

In this embodiment, since the semiconductor layer 24 has a high doping concentration of N-type impurities, an upper and a lower interfaces thereof that are in contact with the first electrode 14 and the first-type semiconductor layer 34 are both low-impedance interfaces, and in this way, an internal current in the red light emitting diode 1 may be allowed to smoothly pass through.

In this embodiment, the reflective layer 44 and the soldering portion 14a of the first electrode 14 are disposed in a misaligned manner, and from another viewpoint, the vias V3 of the reflective layer 44 overlap with the soldering portion 14a. Note that if the reflective layer overlaps with the soldering portion, the reflective layer may bulge, and an unevenness problem may occur in the first electrode pad during subsequent fabrication. Through the aforementioned arrangement, the problem of unevenness in the first electrode pad may be prevented. In other embodiments that are not shown, it may be the reflective layer and the soldering portion of the second electrode that are disposed in a misaligned manner, which is not limited by the disclosure.

From the second side SS2 of the epitaxial stacked layer 12, the bonding layer 32 is disposed on the upper surface US of the substrate 10. The lower insulating layer 30 is disposed on an upper surface of the bonding layer 32. The epitaxial stacked layer 12 is disposed on the lower insulating layer 30, and the conductive structure layer 28 and the second electrode 16 are provided therebetween. The conductive structure layer 28 is located between the second-type semiconductor layer 38 and the second electrode 16. An upper surface of the conductive structure layer 28 is in contact with the second-type semiconductor layer 38, and a lower surface of the conductive structure layer 28 is in contact with the second electrode 16 and the insulating layer 30. Since the conductive structure layer 28 exhibits favorable conducting properties, the internal current in the red light emitting diode 1 may be allowed to smoothly pass through.

With reference to FIG. 1B, the red light emitting diode 1 may be connected to an external substrate (not shown) through the first and the second electrode pads 20 and 22. A current I may be provided by the external substrate, enters the red light emitting diode 1 through the second electrode pad 22, sequentially flows through the second electrode 16, the conductive structure layer 28, the second-type semiconductor layer 38, the light emitting layer 36, the first-type semiconductor layer 36, the semiconductor layer 24, the first electrode 14, and flows out of the red light emitting diode 1 from the first electrode pad 20. The light emitting layer 36 emits a light beam L during electrification. A light beam L1 of one portion of the light beam L may be directly emitted out of the red light emitting diode 1 towards the substrate 10, a light beam L2 of another portion may be reflected by the reflective layer 44 in the reflective stacked layer 18 and is emitted out of the red light emitting 1 towards the substrate 10, and a light beam L3 of still another portion may be reflected by the first or the second electrode 14 or 16 and is emitted out of the red light emitting diode 1 towards the substrate 10. Therefore, overall light emitting efficiency of the red light emitting diode 1 is improved through the arrangement of the reflective stacked layer 18.

As described above, since the red light emitting diode 1 of this embodiment is provided in a form of a flip-chip light emitting diode, the red light emitting diode 1 may be electrically connected to an external substrate (e.g., an array substrate of a display) in a flip-chip manner through the two electrode pads 20 and 22. In this way, arrangement of a wire-bonding region may be omitted, so that a volume of a light emitting diode device (e.g., a light emitting diode display) may be effectively reduced, and favorable applicability is thereby provided. In addition, since the red light emitting diode 1 of this embodiment is a flip-chip light emitting diode, heat dissipation may be performed through the internal first and second electrodes 14 and 16 and the first and the second electrode pads 20 and 22 to dissipate heat to the outside, and that heat dissipation efficiency is improved.

In addition, in other embodiments that are not shown, side surfaces of the first and the second insulating layers are exposed to the outside, but the first and the second insulating layers completely cover the reflective layer. Through such arrangement, the reflective layer of the reflective stacked layer may be prevented from being damaged due to being exposed to the outside, so reliability of the devices is improved.

It should be explained that a part of the contents in the previous embodiments are used in the following embodiments, in which repeated description of the same technical contents is omitted, and elements which are named identically may be referred the part of the contents. A detailed description will not be repeated in the following embodiments.

Figure 2:
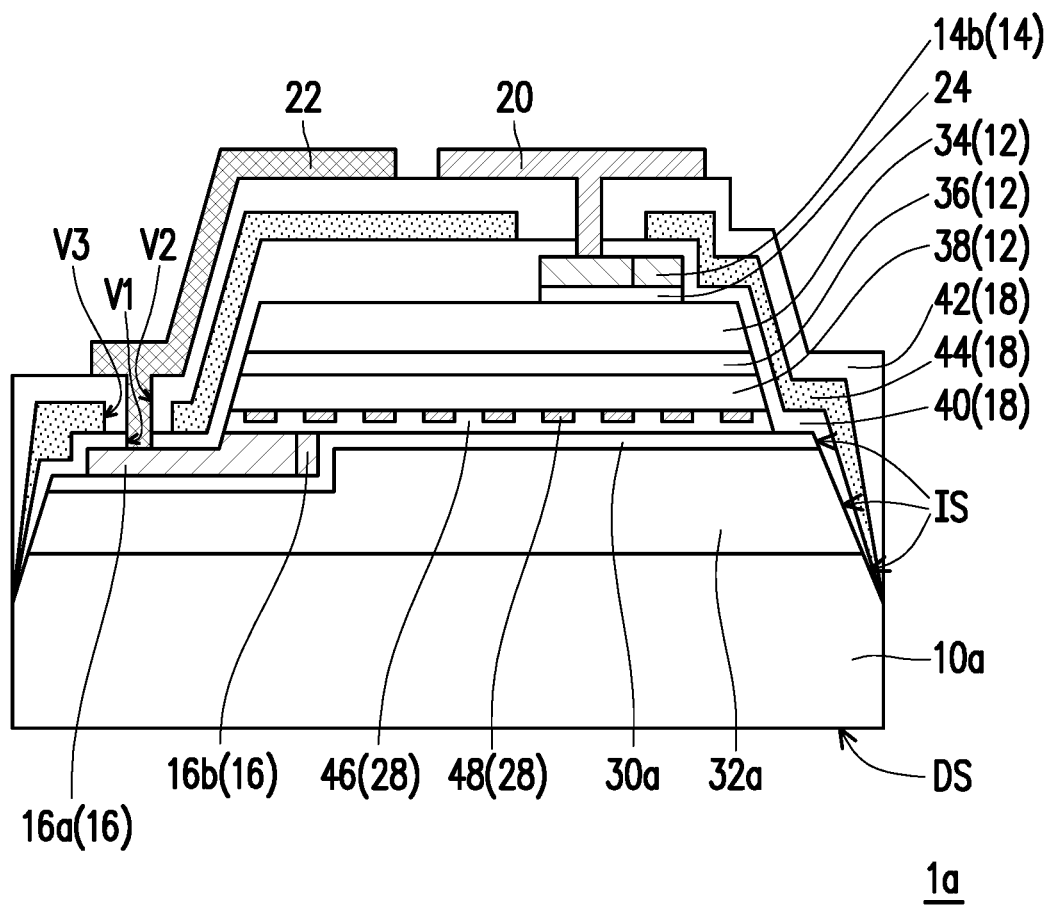
FIG. 2 to FIG. 3 are schematic cross-sectional views of red light emitting diodes according to different embodiments.
Figure 3:
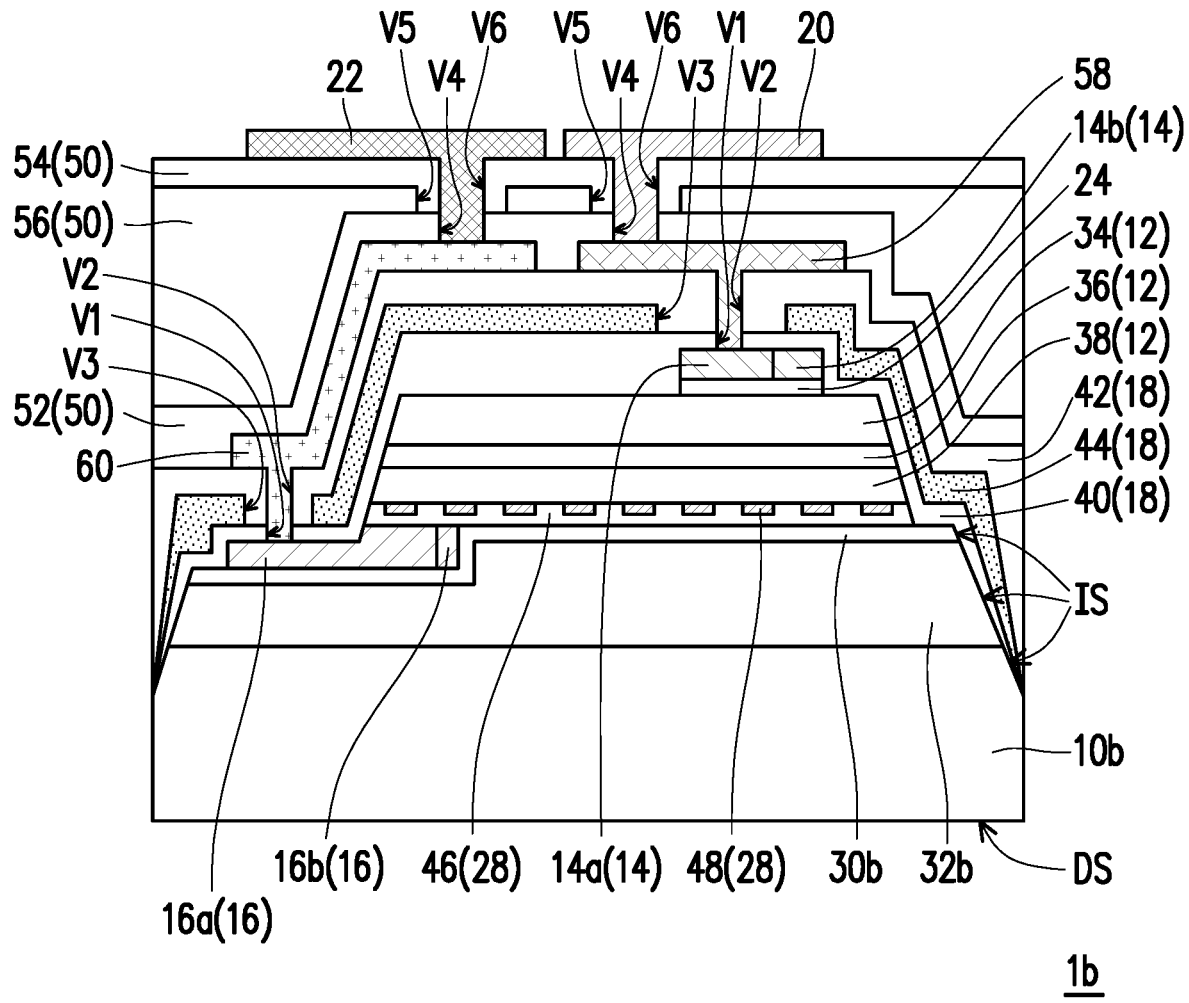

FIG. 2 to FIG. 3 are schematic cross-sectional views of red light emitting diodes according to different embodiments.

With reference to FIG. 2, a red light emitting diode 1a of FIG. 2 is generally similar to the red light emitting diode 1 of FIG. 1, and a main difference lies in that: in the red light emitting diode 1a, side surfaces of a substrate 10a, a bonding layer 32a, and an insulating layer 30a form an inclined surface IS.

With reference to FIG. 3, a red light emitting diode 1b of FIG. 3 is generally similar to the red light emitting diode 1 of FIG. 1, and a main difference lies in that: in the red light emitting diode 1b, side surfaces of a substrate 10b, a bonding layer 32b, and an insulating layer 30b form an inclined surface IS. In addition, the red light emitting diode 1b further includes a buffer stacked layer 50 and a first and a second current conducting layers 58 and 60. The buffer stacked layer 50 includes a third and a fourth insulating layers 52 and 54 and a buffer layer 56. The buffer layer 56 is disposed between the third and the fourth insulating layers 52 and 54, and a material of the third and the fourth insulating layers 52 and 54 is similar to that of the first and the second insulating layers 40 and 42, and description thereof is not repeated herein. A material of the buffer layer 56 may be polyimide (PI), a polymer material, an organic adhesive material, an organic insulating material, a photo sensitive material, or an electrically floating metal material. The first and the second current conducting layers 58 and 60 are configured to perform current conduction in the red light emitting diode 1b, and a material thereof may be chromium, aluminum, silver, platinum, titanium, nickel, gold, gold alloy, aluminum-copper alloy, gold-germanium alloy, gold-beryllium alloy, aluminum alloy, or a combination of the foregoing materials, but is not limited thereto.

In terms of a structural difference, the buffer stacked layer 50 covers the reflective stacked layer 18. The third insulating layer 52 and the fourth insulating layer 54 cover the buffer layer 56 together, and side surfaces of the third and the fourth insulating layers 52 and 54 and the buffer layer 56 are exposed to the outside. The first and the second current conducting layer 58 and 60 are disposed between the reflective stacked layer 18 and the buffer stacked layer 50 More specifically, the third insulating layer 52 of the buffer stacked layer 50 and the second insulating layer 42 of the reflective stacked layer 18 cover the first and the second current conducting layers 58 and 60 together.

In this embodiment, the third insulating layer 52 of the buffer stacked layer 50 has a plurality of vias V4 (also called as fourth vias), the buffer layer 56 has a plurality of vias V5 (also called as fifth vias), and the fourth insulating layer 54 has a plurality of vias V6 (also called as sixth vias). The first and the second current conducting layers 58 and 60 are electrically connected to the first electrode 14 and the second electrode 16 respectively through these vias V1 to V3. The first and the second electrode pads 20 and 22 are electrically connected to the first current conducting layer 58 and the second current conducting layer 60 respectively through these vias V4, V5, and V6. The first electrode pad 20 is electrically connected to the first electrode 14 through the first current conducting layer 58, and the second electrode pad 22 is electrically connected to the second electrode 16 through the second current conducting layer 60.

As described above, in the red light emitting diode 1b, since the buffer stacked layer 56 is disposed, even though heat may be generated by the red light emitting diode 1b owing to long-term use and thermal stress may thereby be generated by internal devices of the red light emitting diode 1b, effects generated by such stress may be effectively reduced by the buffer stacked layer 50. The red light emitting diode 1b may therefore exhibit good device reliability.

In addition, in other embodiments that are not shown, side surfaces of the third and the fourth insulating layers are exposed to the outside, but the third and the fourth insulating layers completely cover the buffer layer. Generally, since the material of the buffer layer is soft, through such arrangement, the buffer layer may be prevented from being damaged due to being exposed to the outside, so reliability of the devices is improved.

Figure 4A:
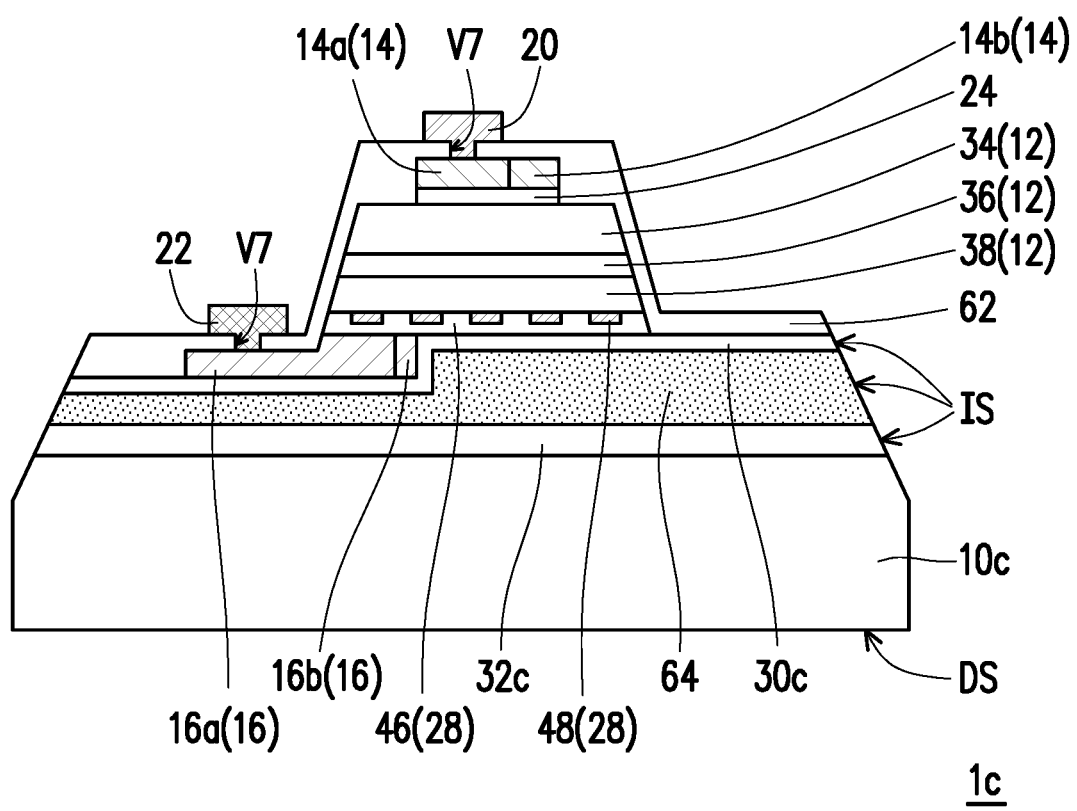
FIG. 4A is a schematic cross-sectional view of a red light emitting diode according to an embodiment of the disclosure.
Figure 4B:
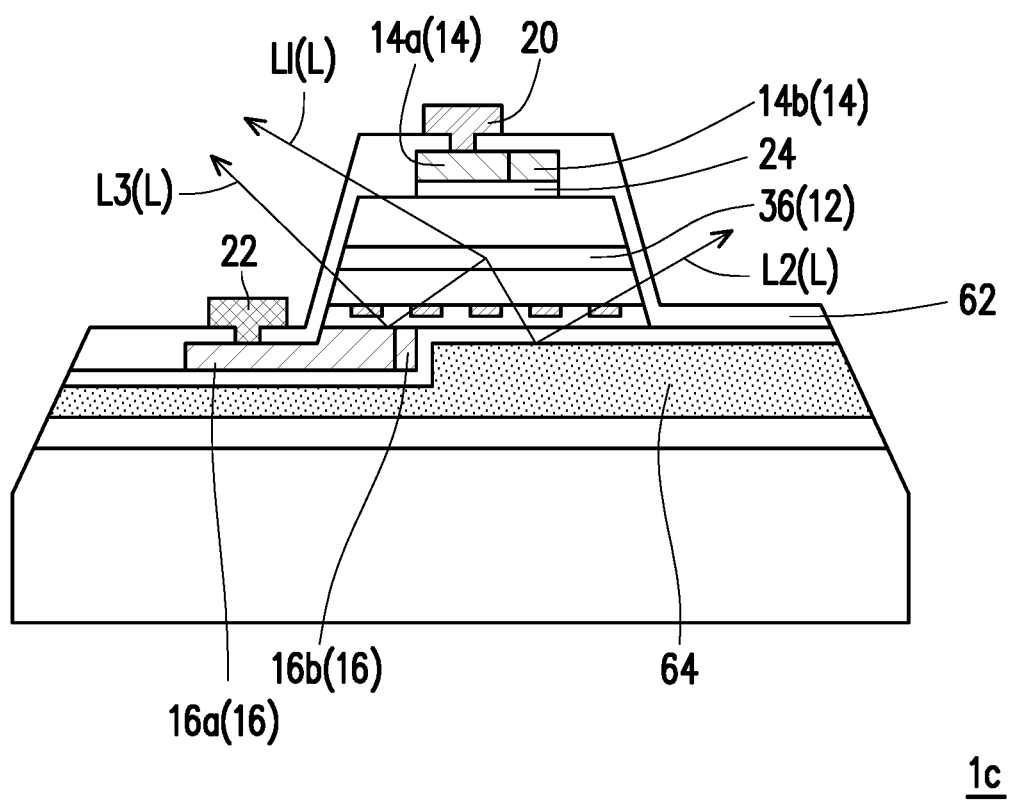
FIG. 4B is schematic diagram of an optical effect of the red light emitting diode in FIG. 4A.
Figure 4C:
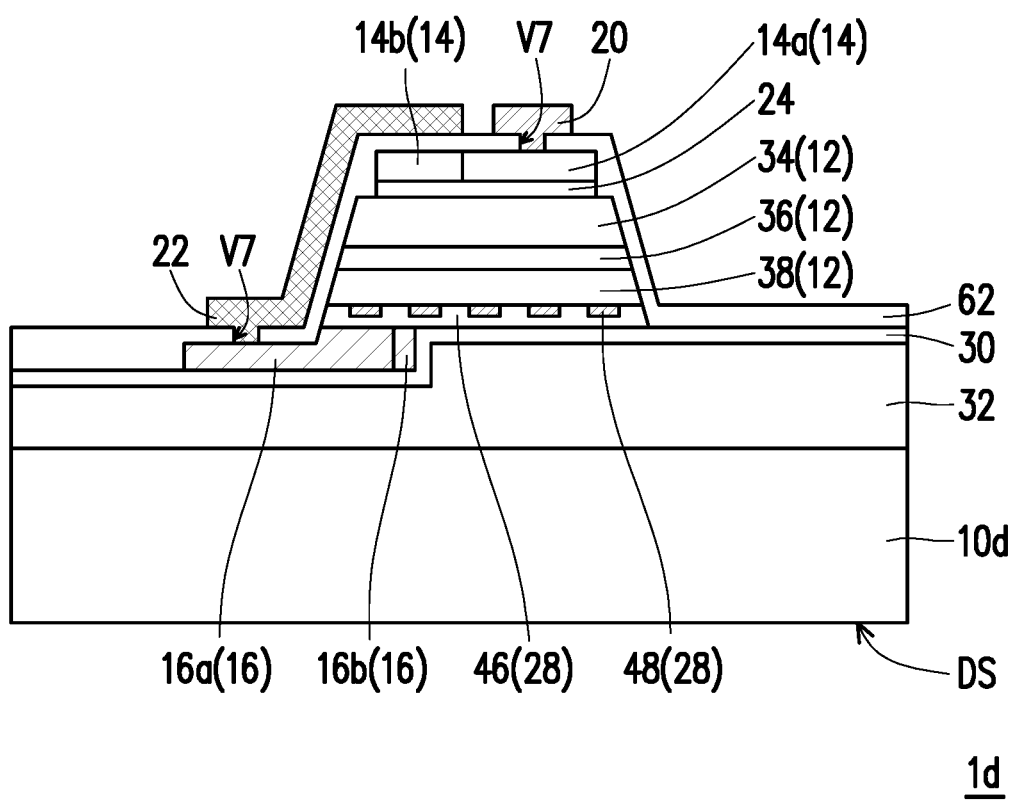
FIG. 4C is a schematic cross-sectional view of a red light emitting diode according to another embodiment of the disclosure.

FIG. 4A is a schematic cross-sectional view of a red light emitting diode according to an embodiment of the disclosure. FIG. 4B is schematic diagram of an optical effect of the red light emitting diode in FIG. 4A. FIG. 4C is a schematic cross-sectional view of a red light emitting diode according to another embodiment of the disclosure.

With reference to FIG. 4A, a red light emitting diode 1c of FIG. 4A is generally similar to the red light emitting diode 1 of FIG. 1, and a main difference lies in that: the red light emitting diode 1c further includes an upper insulating layer 62 and a reflective layer 64, and side surfaces of a substrate 10c, the reflective layer 64, a bonding layer 32c, a lower insulating layer 30c form an inclined surface IS. Relative to the epitaxial stacked layer 12, the upper insulating layer 62 is located above the epitaxial stacked layer 12 and is thus called as the upper insulating layer, and the lower insulating layer 30c is located below the epitaxial stacked layer 12 and is thus called as the lower insulating layer. A material of the reflective layer 64 is similar to that of the reflective layer 44, and description thereof is not repeated herein.

In terms of a structural difference, the upper insulating layer 62 has a plurality of vias V7 (also called as seventh vias). The three of the first and the second electrodes 14 and 16 and the epitaxial stacked layer 12 are located between the upper insulating layer 62 and the lower insulating layer 30c. The first electrode pad 20 and the second electrode pad 22 are electrically connected to the first electrode 14 and the second electrode 16 respectively by filling the vias V7.

With reference to FIG. 4B, in this embodiment, when the light emitting layer 36 emits a light beam L, a light beam L1 of one portion of the light beam L is directly emitted out from above the red light emitting diode 1, a light beam L2 of another portion is emitted towards the reflective layer 64 and is reflected by the reflective layer 64 to be emitted out of the red light emitting diode 1c from the above, and a light beam L3 of still another portion is reflected by the second electrode 16 and is emitted out of the red light emitting diode 1c from the above. Therefore, overall light emitting efficiency of the red light emitting diode 1c is improved through the arrangement of the reflective layer 64.

With reference to FIG. 4C, a red light emitting diode 1d of FIG. 4C is generally similar to the red light emitting diode 1c of FIG. 4A, and a main difference lies in that: the red light emitting diode 1d does not include the reflective layer 64. A substrate 10d and a bonding layer 32 are disposed at the second side SS2 of the epitaxial stacked layer 12. The substrate 10d has an upper surface. The bonding layer 32 is disposed on the upper surface. The first electrode pad 20 and the second electrode pad 22 are disposed at the first side SS1 of the epitaxial stacked layer 12 or the side corresponding to the carrying substrate 10c, so that the first electrode pad 20 and the second electrode pad 22 may be electrically connected to an external substrate (e.g., an array substrate of a display) in a flip-chip manner through an eutectic or a soldering process.

In addition, side surfaces of the lower insulating layer 30c, the bonding layer 32c, and the substrate 10c are, for example, plane surfaces.

Manufacturing of the above red light emitting diodes 1 and 1a to 1d in FIG. 1 to FIG. 4A and FIG. 4C are described in detail in the following paragraphs. First, a manufacturing process of manufacturing the red light emitting diode 1 in FIG. 1A is described.

Figure 5A:
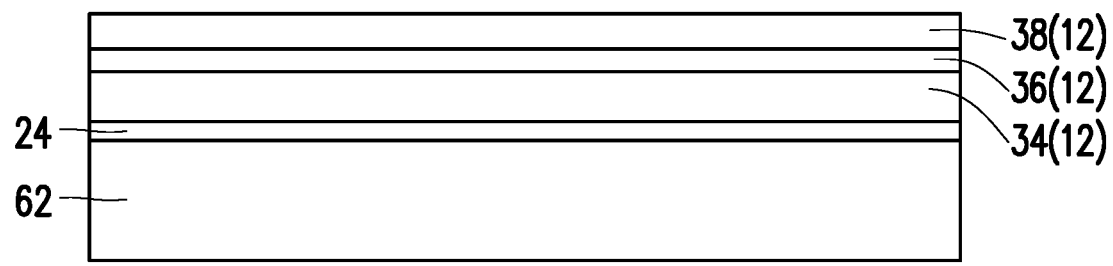
FIG. 5A to FIG. 5N are diagrams of a manufacturing process of manufacturing the red light emitting diode in FIG. 1A.
Figure 5B:
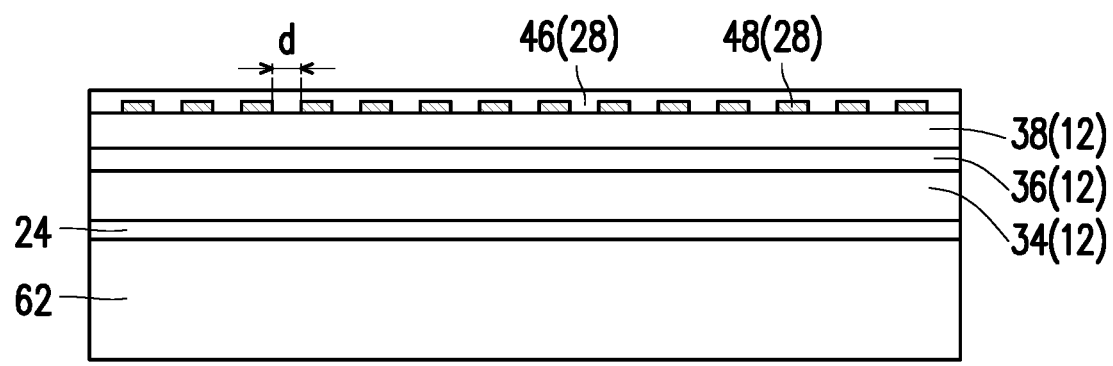
Figure 5C:
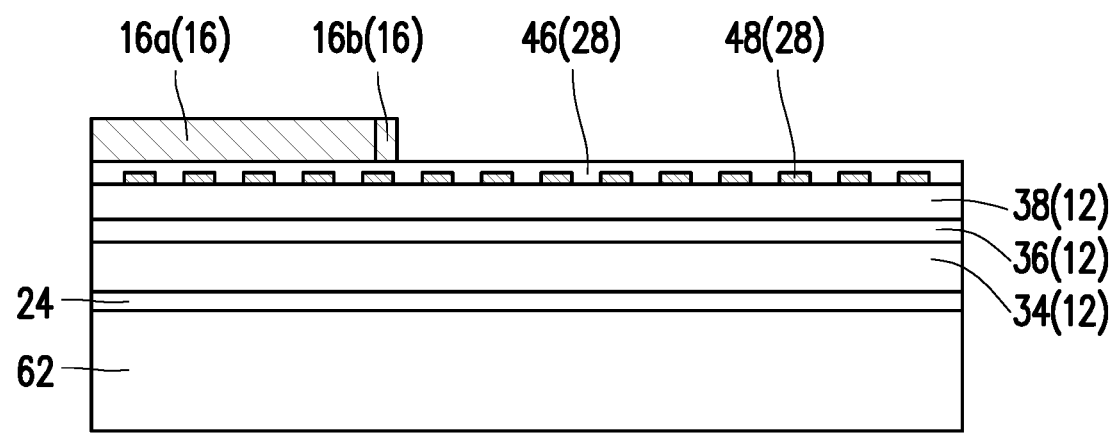
Figure 5D:
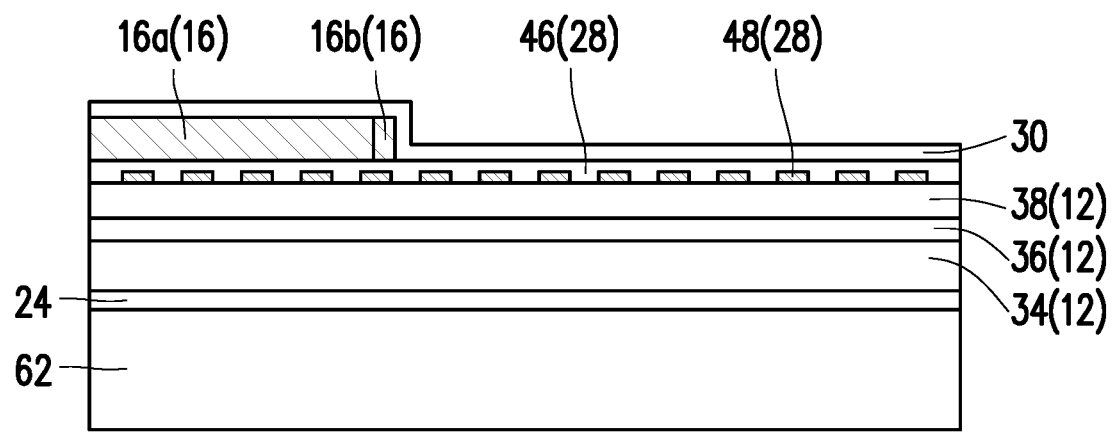
Figure 5E:
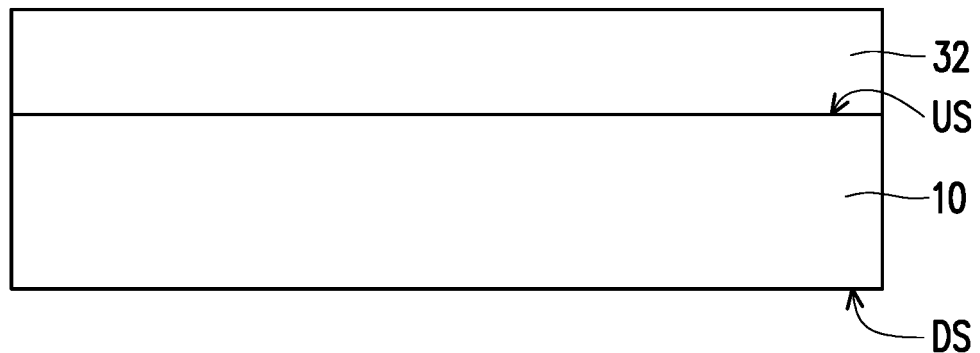
Figure 5F:
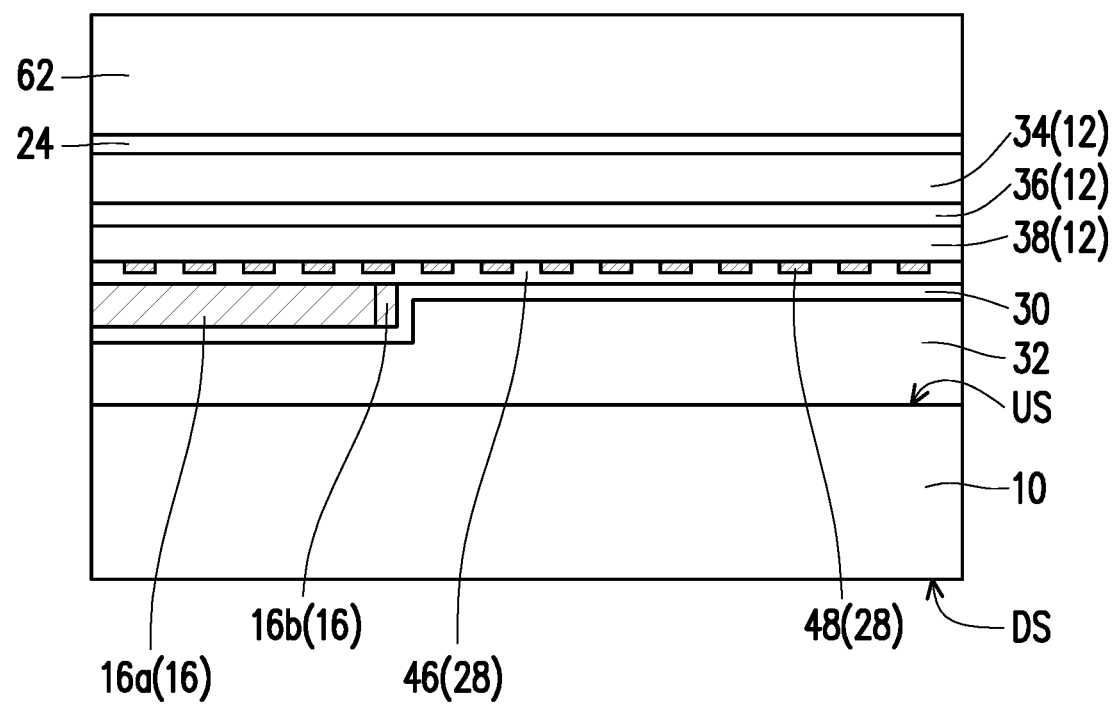
Figure 5G:
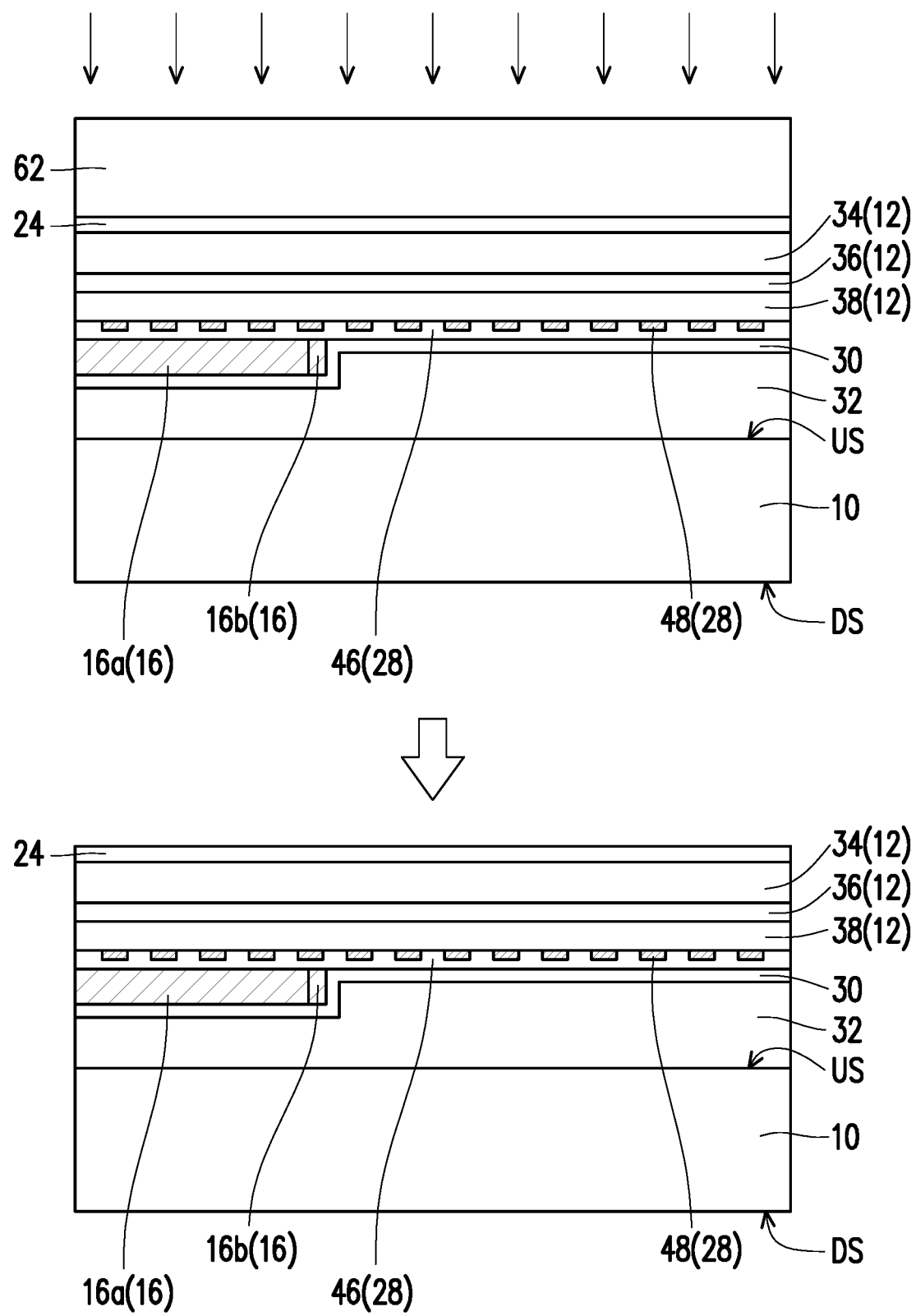
Figure 5H:
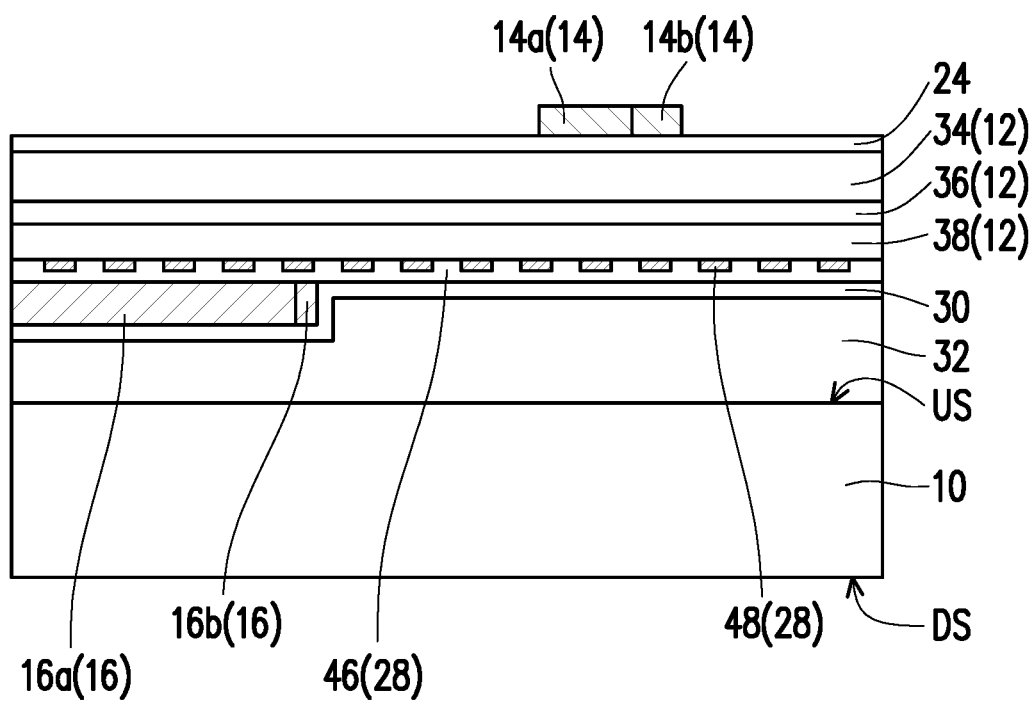
Figure 5I:
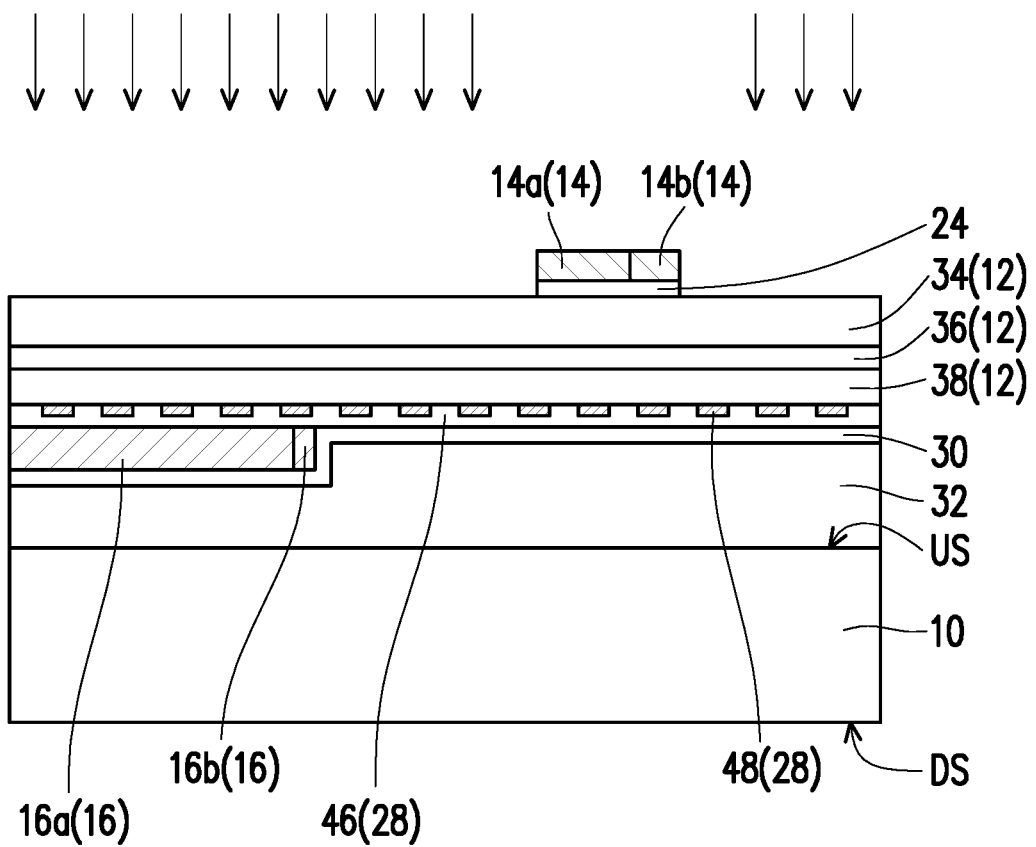
Figure 5J:
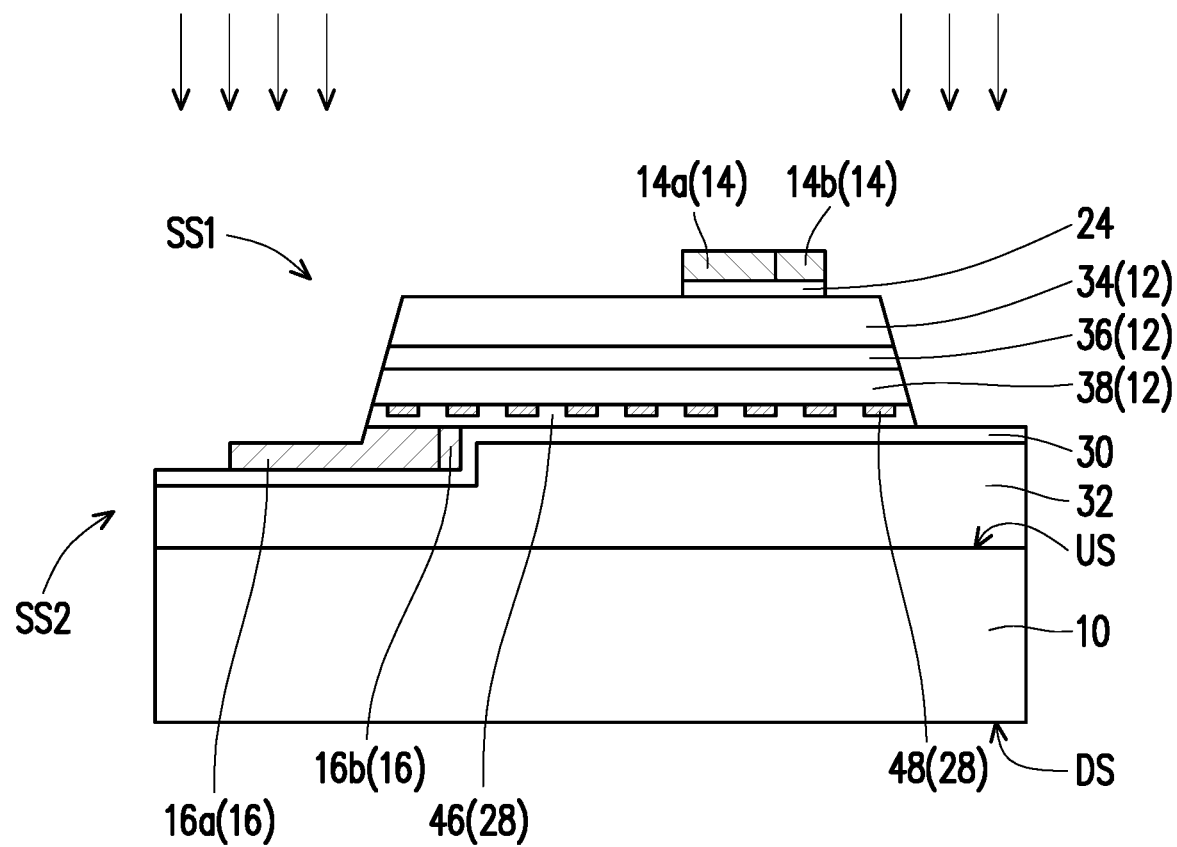
Figure 5K:
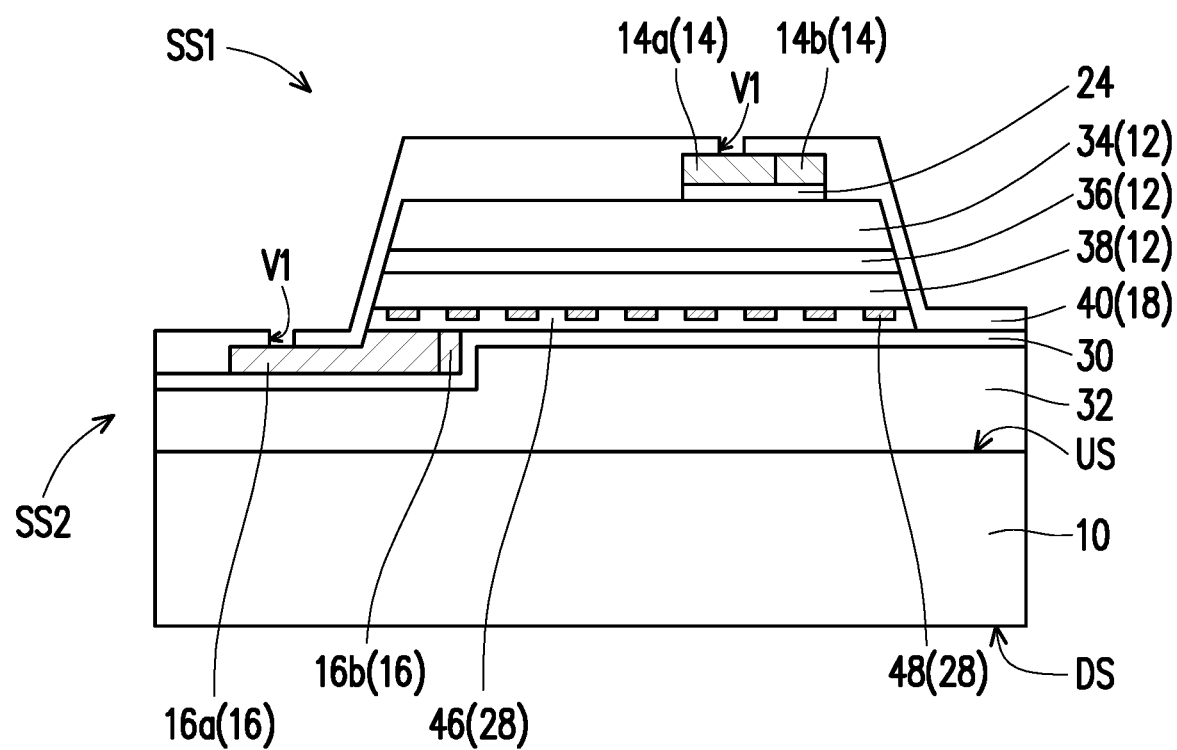
Figure 5L:
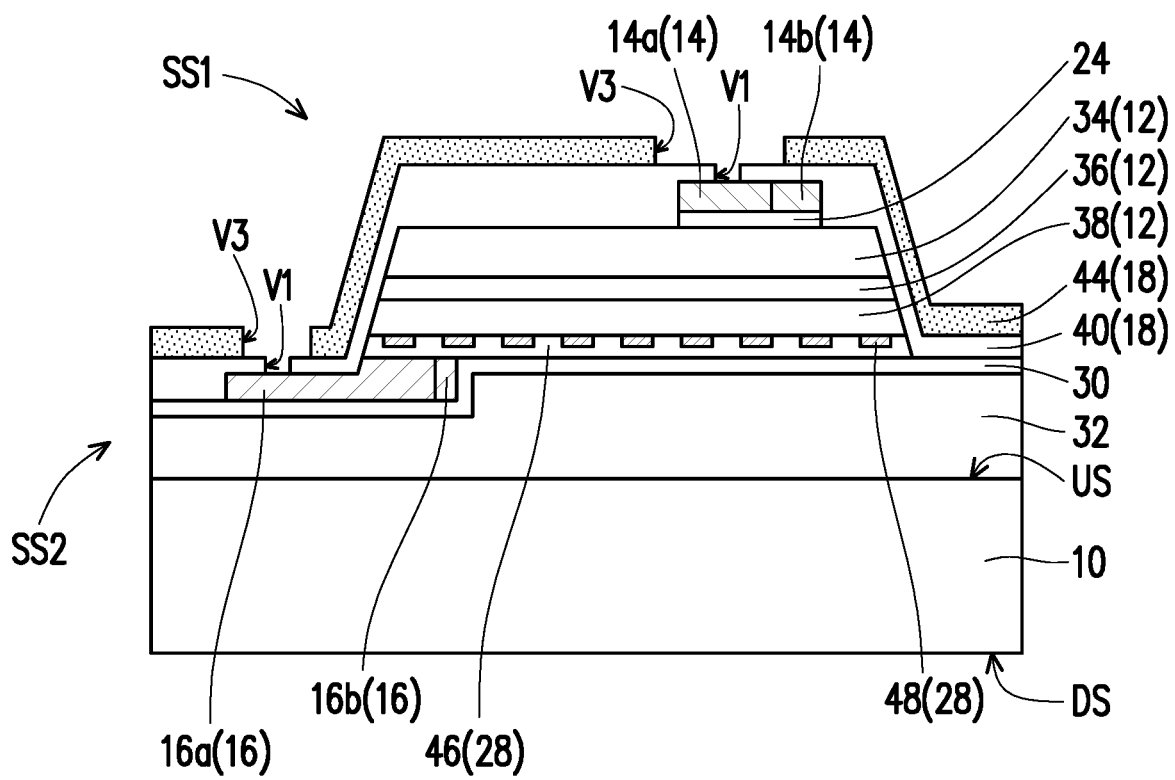
Figure 5M:
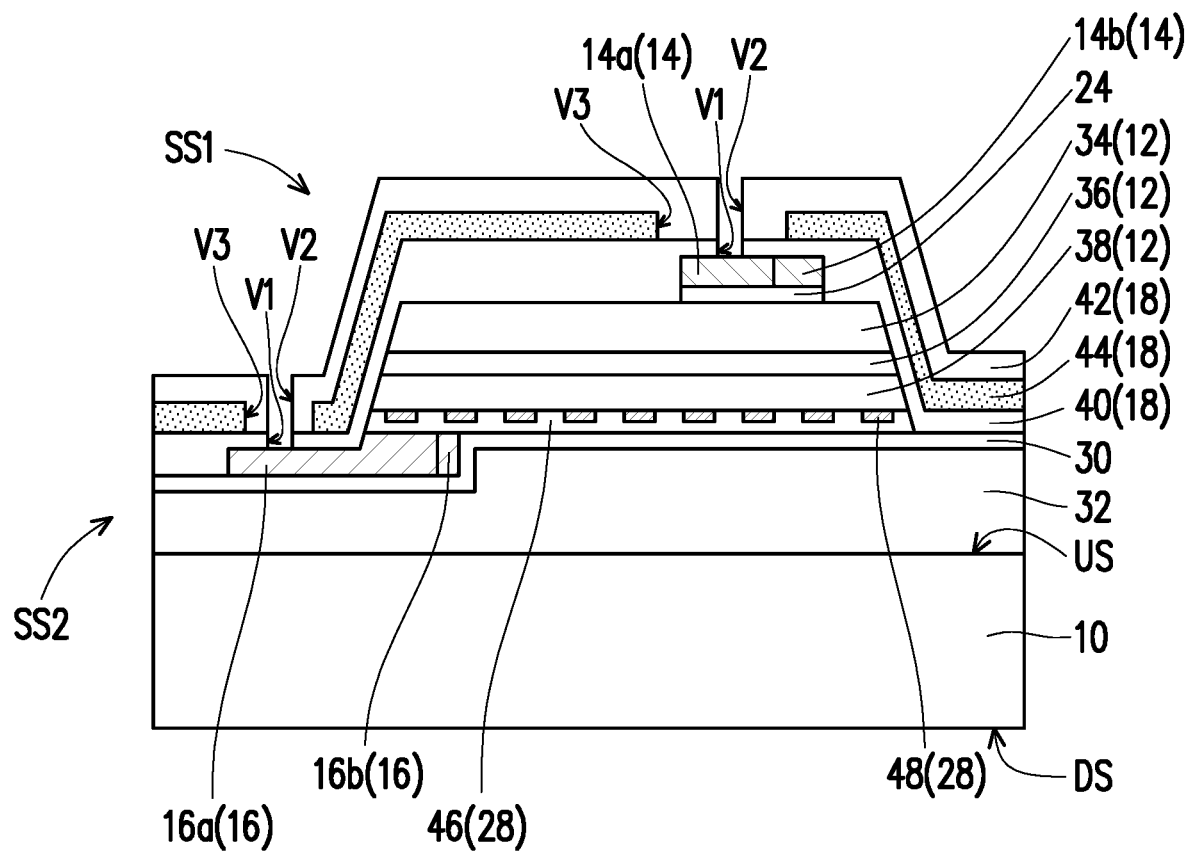
Figure 5N:
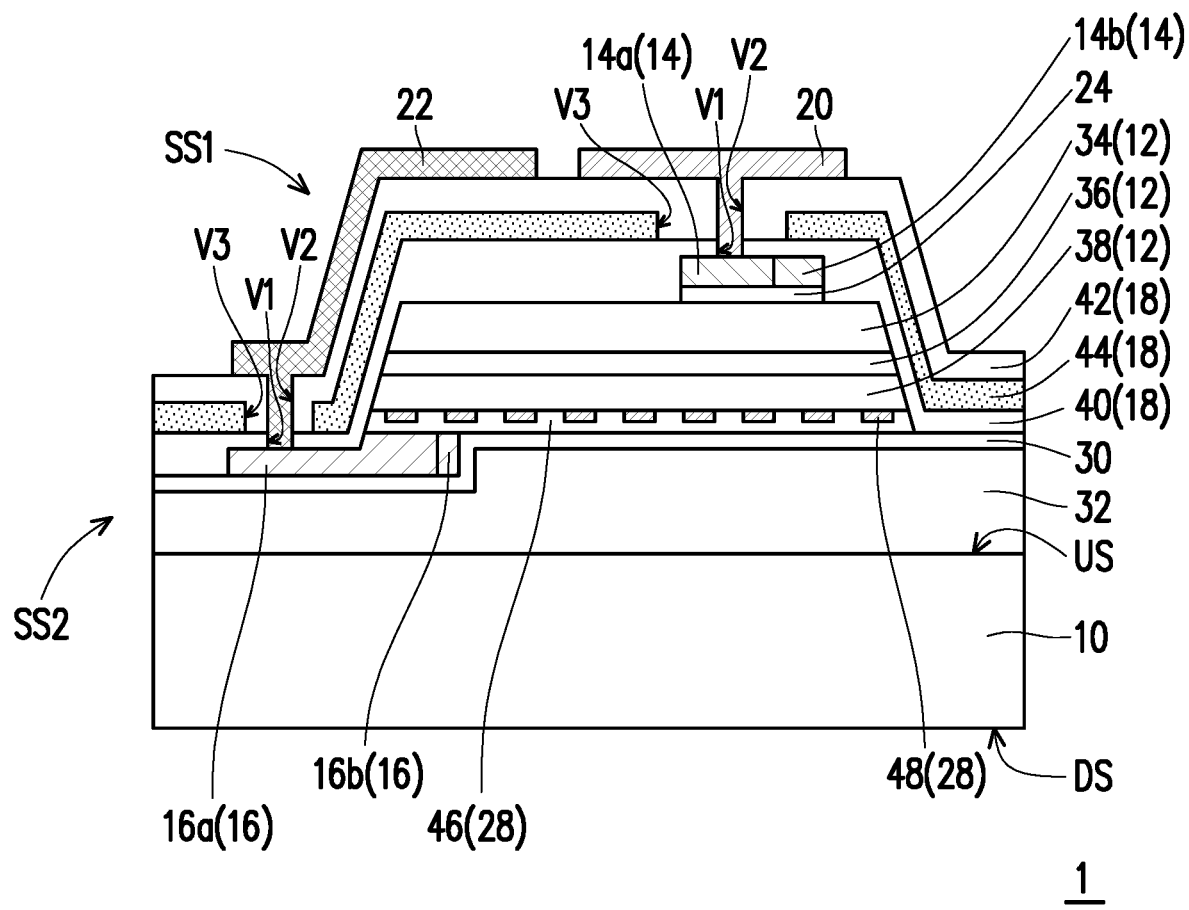
Figure 6A:
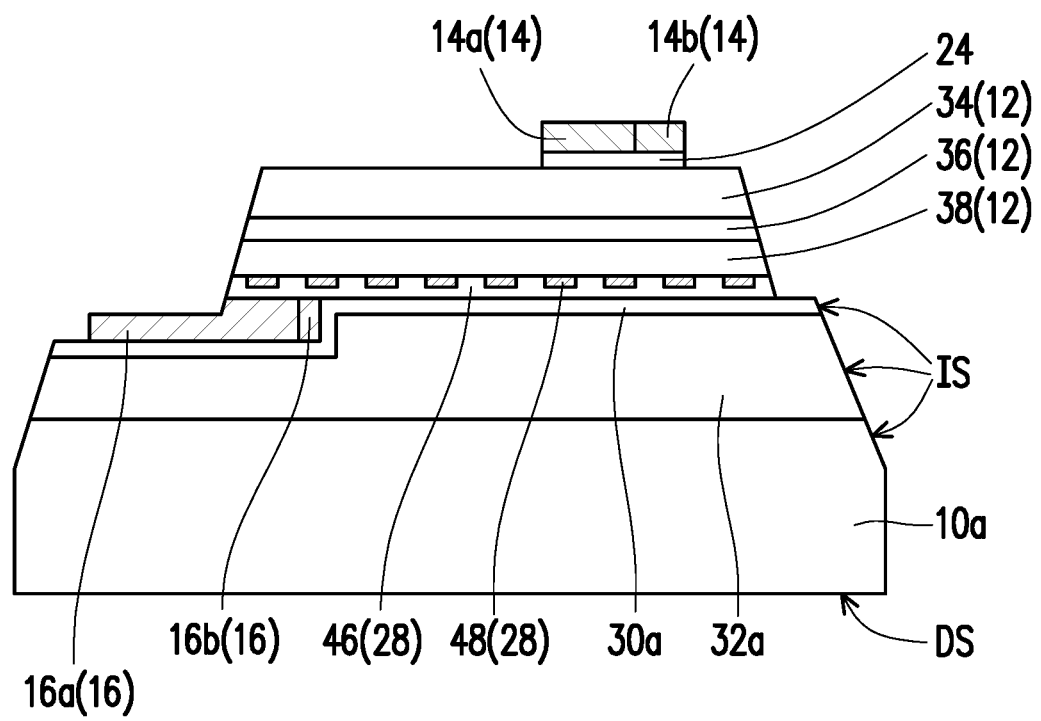
FIG. 6A to FIG. 6E are diagrams of a partial manufacturing process of manufacturing the red light emitting diode in FIG. 2.
Figure 6B:
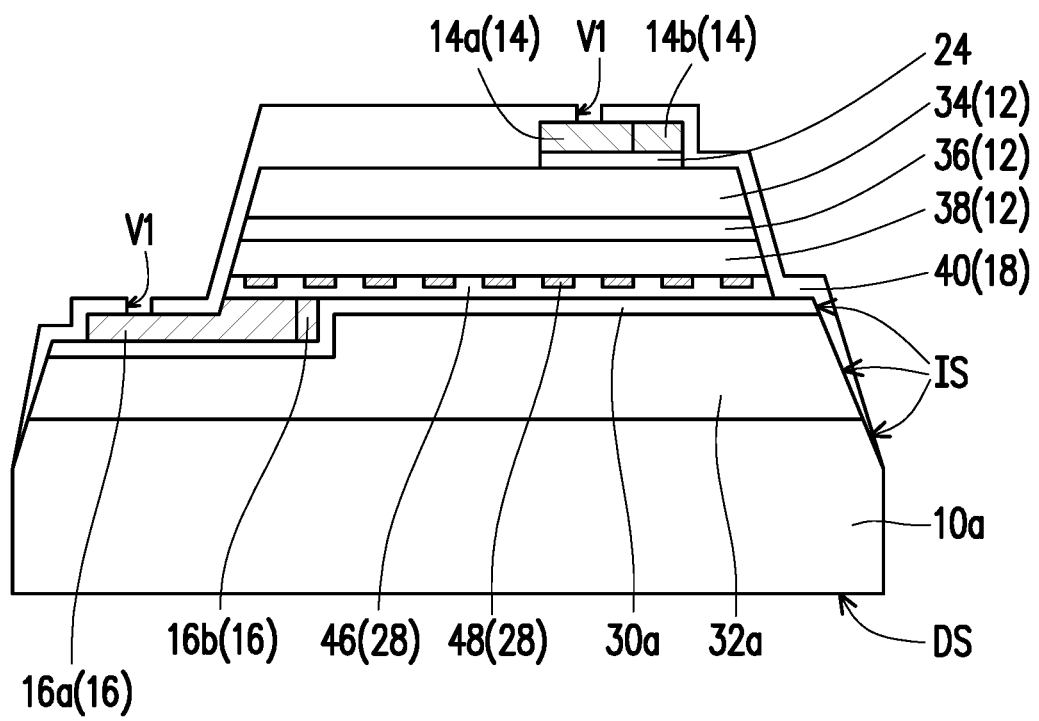
Figure 6C:
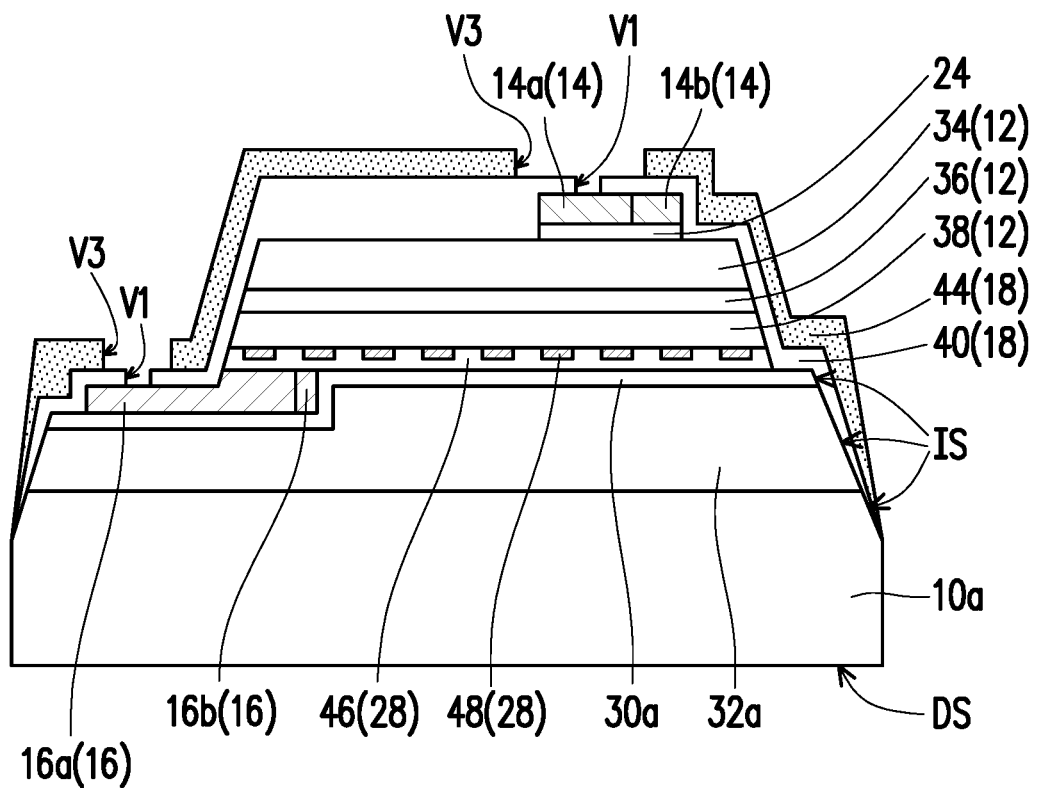
Figure 6D:
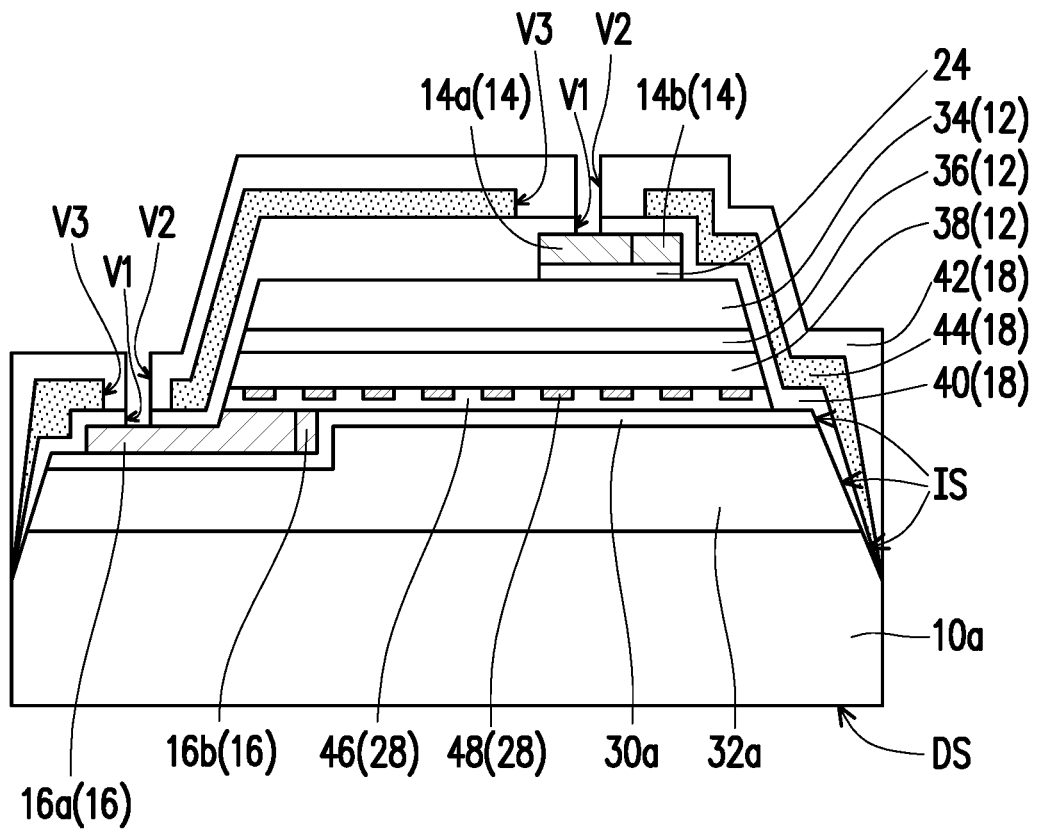
Figure 6E:
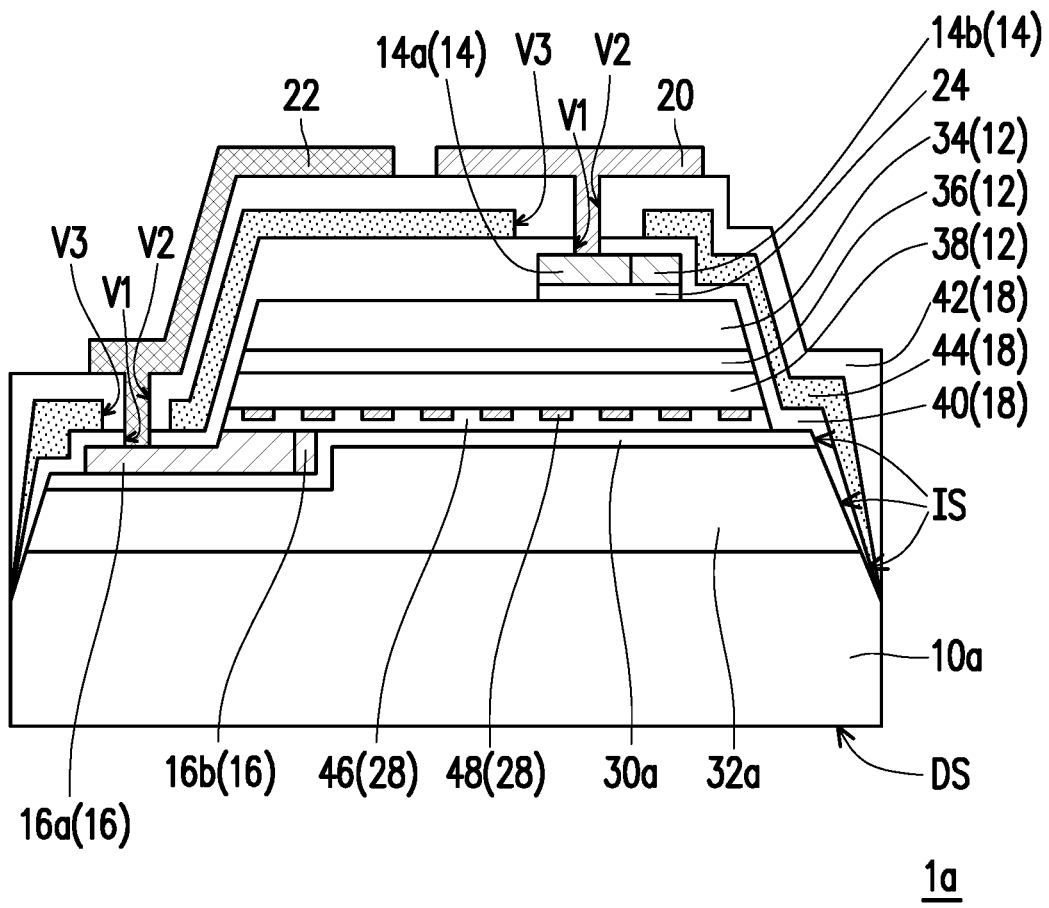

FIG. 5A to FIG. 5N are diagrams of a manufacturing process of manufacturing the red light emitting diode in FIG. 1A.

With reference to FIG. 5A, a growth substrate 62 is provided, and the epitaxial stacked layer 12 is formed on a surface of the growth substrate 62 by an epitaxial process. Specifically, the semiconductor layer 24, the first-type semiconductor layer 34, the light emitting layer 36, and the second-type semiconductor layer 38 are sequentially formed on an upper surface of the growth substrate 62 through the epitaxial process. The epitaxial process may include organic metal chemical vapor deposition, pulsed laser deposition (PLD), chemical vapor deposition (CVD), molecular beam epitaxy (MBE), or other suitable epitaxial manufacturing manners, which is not limited by the disclosure. In addition, a lattice constant of the growth substrate 62 and lattice constants of materials of the semiconductor layer 24, the first-type semiconductor layer 34, the light emitting layer 36, and the second-type semiconductor layer 38 are close, so that the growth substrate 62 may be adapted to grow the semiconductor layer 24, the first-type semiconductor layer 34, the light emitting layer 36, and the second-type semiconductor layer 38.

With reference to FIG. 5B, the conductive structure layer 28 is formed on the epitaxial stacked layer 12, and the conductive structure layer 28 includes the transparent conductive layer 46 and plural ohmic metal structures 48. Specifically, one ohmic metal material layer (not shown) is formed on the second-type semiconductor layer 38 of the epitaxial stacked layer 12 first. Next, a portion of the ohmic metal material layer is removed through an etching process to pattern the ohmic metal material layer, and that the ohmic metal structures 48 are formed. A gap d is provided between adjacent two ohmic metal structures 48. Next, the transparent conductive layer 46 is formed to cover the ohmic metal structures 48.

With reference to FIG. 5C, the second electrode 16 is formed on a portion of a surface of the conductive structure layer 28. The second electrode 16 includes the soldering portion 16a and at least one finger portion 16b extending from the soldering portion 16a, and the second electrode 16 is electrically connected to the conductive structure layer 28.

With reference to FIG. 5D, the lower insulating layer 30 is formed on the conductive structure layer 28 and the second electrode 16 to cover the conductive structure layer 28 and the second electrode 16.

With reference to FIG. 5E, a carrying substrate 10 is provided and a bonding layer 32 is disposed on an upper surface US of the carrying substrate 10.

With reference to FIG. 5F, the structure in FIG. 5D is flipped, so that the insulating layer 30 is bonded onto the bonding layer 32, and that the epitaxial stacked layer 12 is bonded onto the substrate 10.

With reference to FIG. 5G, an etching process is performed, and the growth substrate 62 is etched and is exposed out of the semiconductor layer 24. The etching process is, for example, a wet etching process, but is not limited thereto.

With reference to FIG. 5H, the first electrode 14 is formed on the semiconductor layer 24, and a heating process is performed. The temperature of the heating process is approximately 400 degrees, so that a low-impedance interface is formed between the first electrode 14 and the semiconductor layer 24, and the first electrode 14 includes the soldering portion 14a and at least one finger portion 14b extending from the soldering portion 14a.

With reference to FIG. 5I, an etching process is performed to remove the semiconductor layer 24 not overlapping with the first electrode 14 and expose a part of the first-type semiconductor layer 34.

With reference to FIG. 5J, an etching process is performed to etch a portion of the epitaxial stacked layer 12 and a portion of the second electrode 16 to expose the second electrode 16 and the lower insulating layer 30. The etching process used in the step of FIG. 5J is: an inductively coupled plasma reactive-ion etching (ICP-RIE) process, for example.

With reference to FIG. 5K, the first insulating layer 40 of the reflective stacked layer 18 is formed to cover the epitaxial stacked layer 12 and the first and the second electrodes 14 and 16, and parts of the first insulating layer 40 are etched to form the plurality of vias V1. One part of the vias V1 expose the soldering portion 14b of the first electrode 14, and the other part of the vias V1 expose the soldering portion 16b of the second electrode 16.

With reference to FIG. 5L, the reflective layer 44 of the reflective stacked layer 18 is formed to cover the first insulating layer 40, and parts of the reflective layer 44 are etched to form the plurality of vias V3. Positions of the vias V3 respectively align with positions of the vias V1, and an aperture of each of the vias V3 is greater than an aperture of each of the vias V1. A yellow light lithography peeling (lift-off) process may be specifically used to form the reflective layer 44, so that the reflective layer 44 is formed on the first insulating layer 40.

With reference to FIG. 5M, the second insulating layer 42 of the reflective stacked layer 18 is formed to cover the reflective layer 44, and parts of the second insulating layer 42 are etched to form the plurality of vias V2. Positions of the vias V2 respectively align with the positions of the vias V3 and V1. An aperture of each of the vias V2 is equal to the aperture of each of the vias V1 but is less than the aperture of each of the vias V3. The specific method used to form the vias V1 and V2 is, for example, an etching process to form the plurality of vias V2 and the plurality of vias V1, and side surfaces of the vias V1 and the vias V2 are substantially aligned.

With reference to FIG. 5N, the first electrode pad 20 and the second electrode pad 22 are formed on the second insulating layer 42, and portions of the vias V1 to V3 are filled with the first electrode pad 20 and the second electrode pad 22 respectively, so that the first electrode pad 20 and the second electrode pad 22 are electrically connected to the first and the second electrodes 14 and 16 respectively. Manufacturing of the red light emitting diode 1 is generally completed so far.

FIG. 6A to FIG. 6E are diagrams of a partial manufacturing process of manufacturing the red light emitting diode in FIG. 2.

The manufacturing process of manufacturing the red light emitting diode 1a in FIG. 2 is generally similar to the manufacturing process of manufacturing the red light emitting diode 1 in FIG. 1. In continuation to FIG. 5J, with reference to FIG. 6A, a cutting process is performed on the side surfaces of the lower insulating layer 30a, the bonding layer 32a, and the substrate 10a, so that the side surfaces of the lower insulating layer 30a, the bonding layer 32a, and the substrate 10a form the inclined surface IS.

With reference to FIG. 6B to FIG. 6E, the steps thereof are similar to that provided in FIG. 5K to FIG. 5N, and the reflective stacked layer 18 covers the inclined surface IS, so description is not repeated herein. Manufacturing of the red light emitting diode 1a is generally completed so far.

FIG. 7A to FIG. 7E are diagrams of a partial manufacturing process of manufacturing the red light emitting diode in FIG. 3.

The manufacturing process of manufacturing the red light emitting diode 1b in FIG. 3 is generally similar to the manufacturing process of manufacturing the red light emitting diode 1 in FIG. 1, and a main difference lies in that: in continuation to FIG. 5J first, a cutting process is performed on the side surfaces of the insulating layer 30b, the bonding layer 32b, and the substrate 10b, so that the side surfaces of the insulating layer 30b, the bonding layer 32b, and the substrate 10b form the inclined surface IS. Next, the steps as shown in FIG. 5K to FIG. 5M are performed to manufacture the reflective stacked layer 18. Next, with reference to FIG. 7A, the first current conducting layer 58 and the second current conducting layer 60 are formed on the first insulating layer 40, and portions of the vias V1 to V3 are filled with the first current conducting layer 58 and the second current conducting layer 60 respectively, so that the first current conducting layer 58 and the second current conducting layer 60 are electrically connected to the first and the second electrodes 14 and 16 respectively.

Figure 7A:
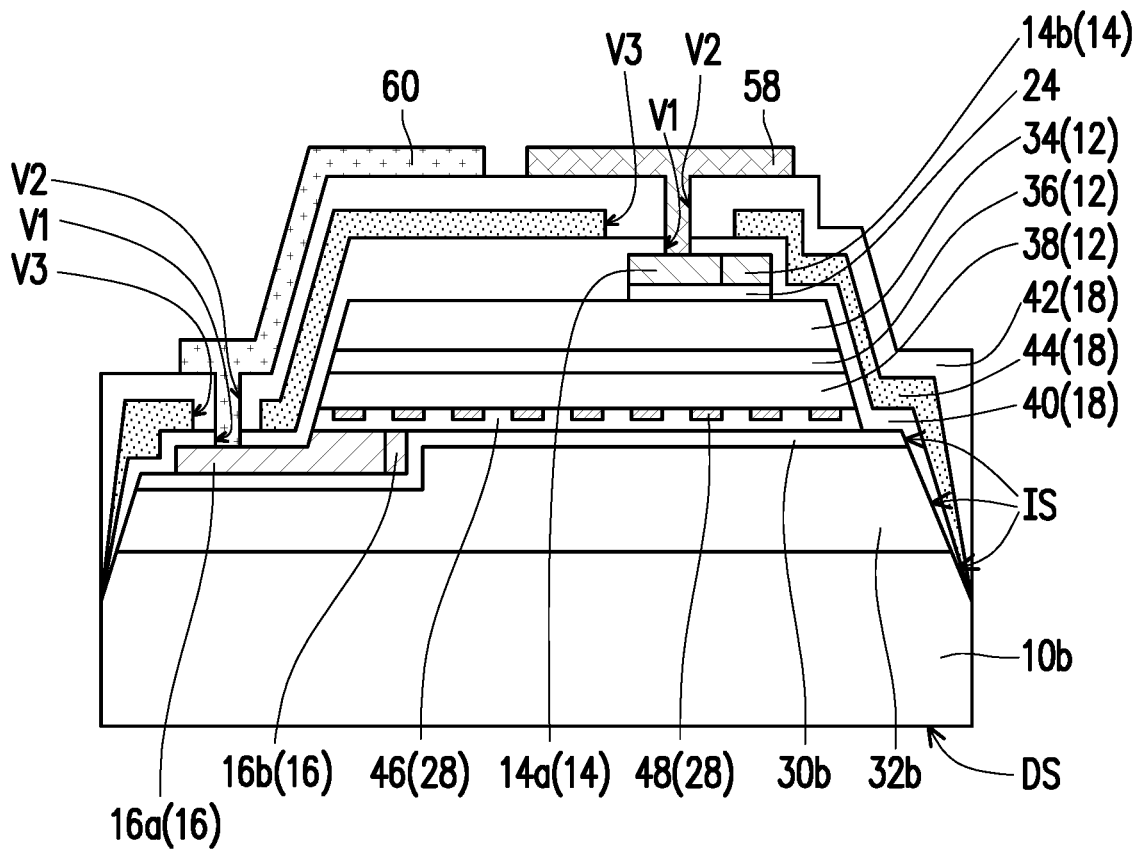
FIG. 7A to FIG. 7E are diagrams of a partial manufacturing process of manufacturing the red light emitting diode in FIG. 3.
Figure 7B:
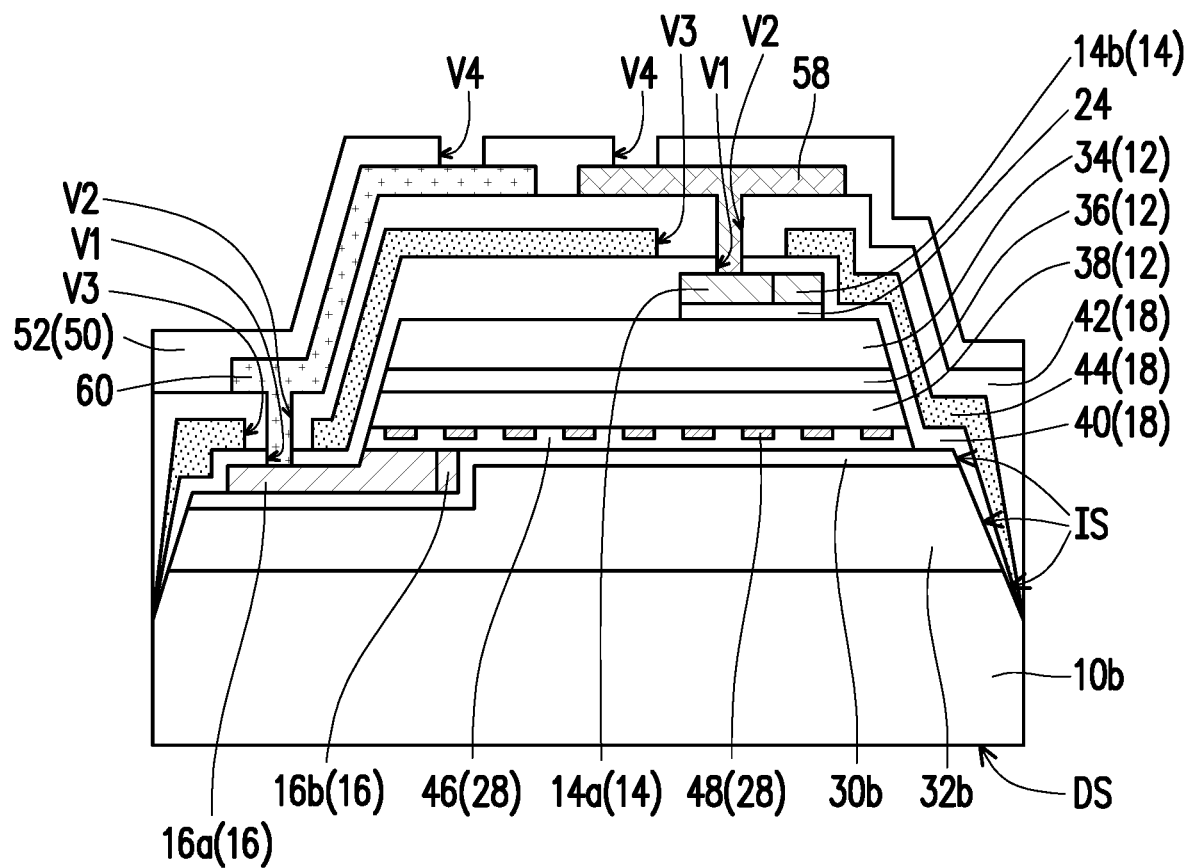

With reference to FIG. 7B, the third insulating layer 52 of the buffer stacked layer 50 is formed on the first current conducting layer 58, the second current conducting layer 60, and the reflective stacked layer 18, parts of the third insulating layer 52 are etched to formed the plurality of vias V4, one part of the vias V4 expose the first current conducting layer 58, and the other part of the vias V4 expose the second current conducting layer 60.

Figure 7C:
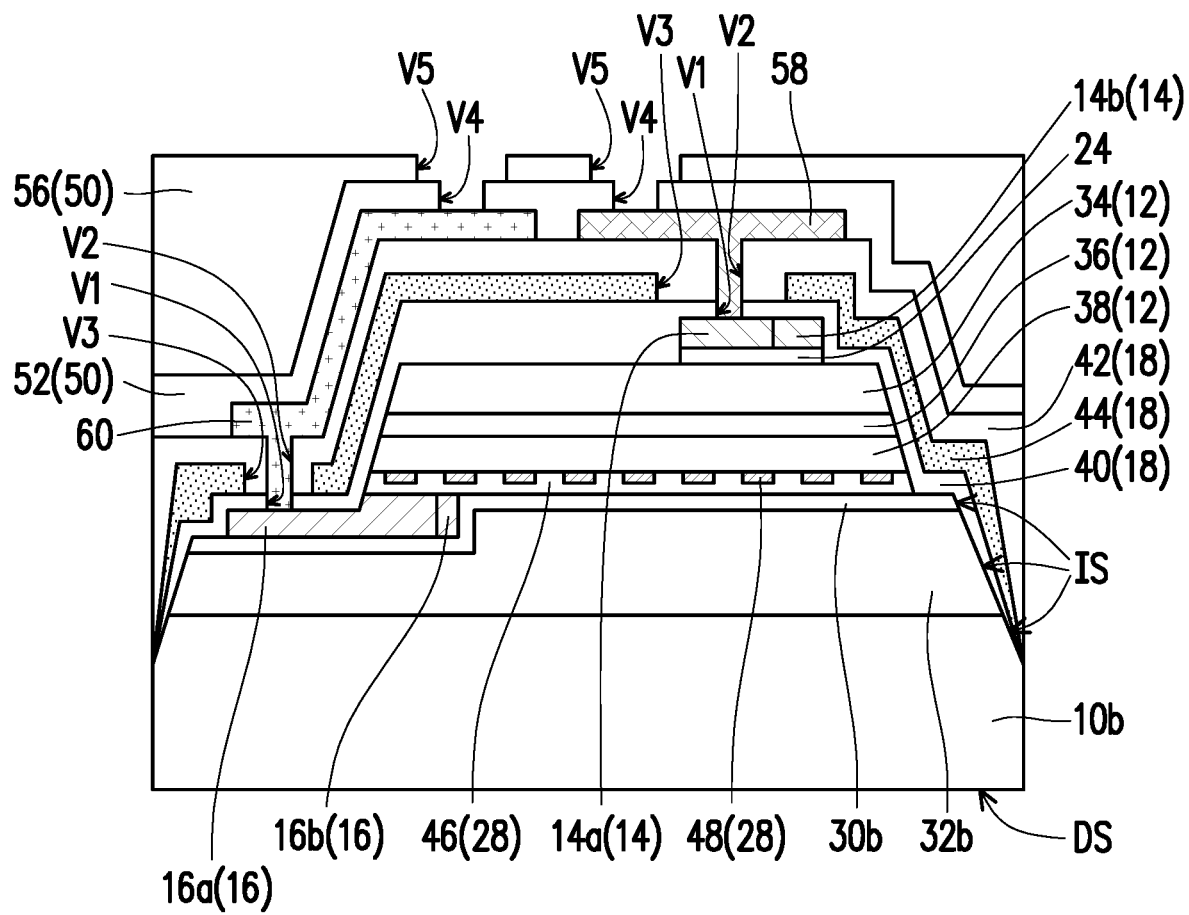

With reference to FIG. 7C, the buffer layer 56 of the buffer stacked layer 50 is formed to cover the fourth insulating layer 54, and parts of the buffer layer 56 are etched to form the plurality of vias V5. Positions of the vias V5 respectively align with positions of the vias V4, and an aperture of each of the vias V5 is greater than an aperture of each of the vias V4.

Figure 7D:
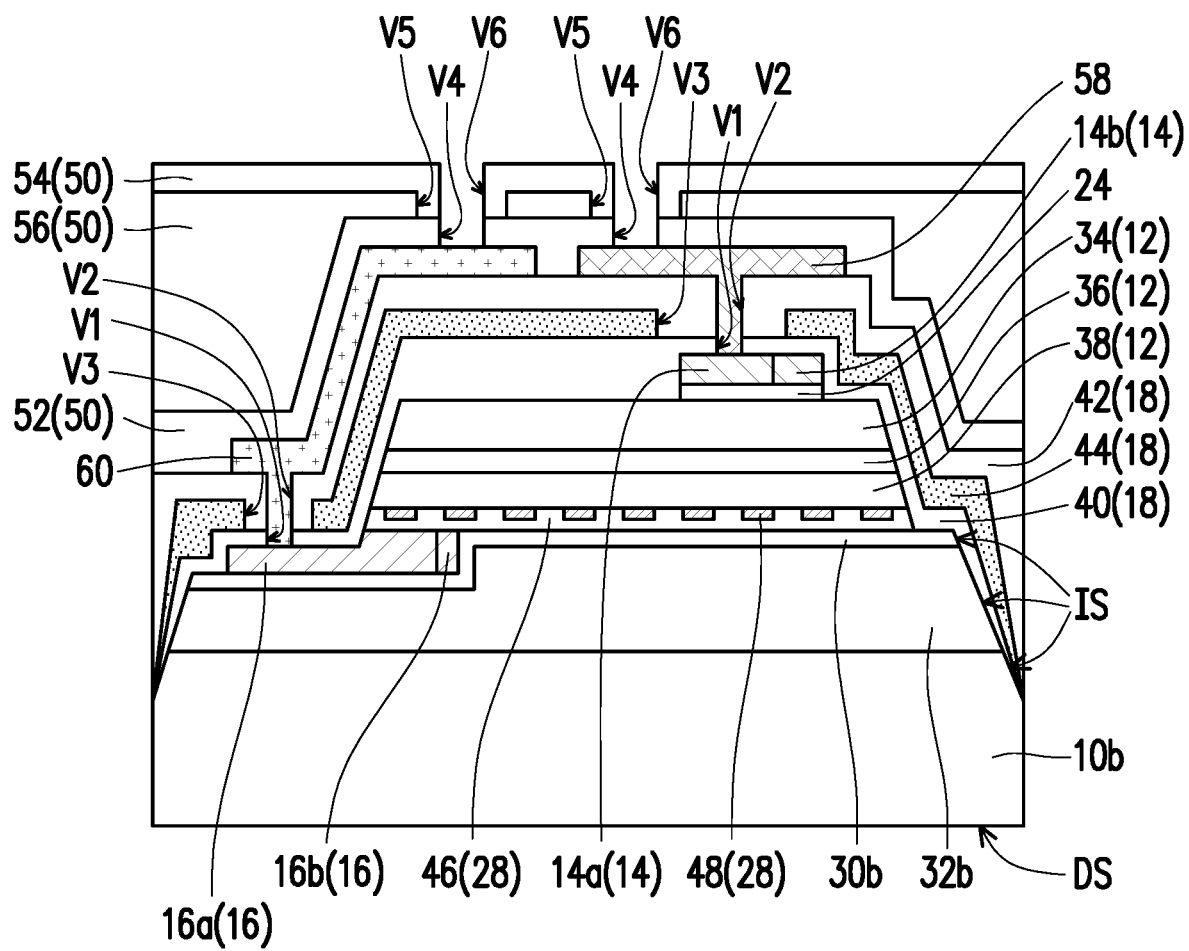

With reference to FIG. 7D, the fourth insulating layer 54 of the buffer stacked layer 50 is formed to cover the buffer layer 56, and parts of the fourth insulating layer is etched to form the plurality of vias V6. Positions of the vias V6 respectively align with the positions of the vias V5 and V6, and the aperture of each of the vias V4 is equal to an aperture of each of the vias V6.

Figure 7E:
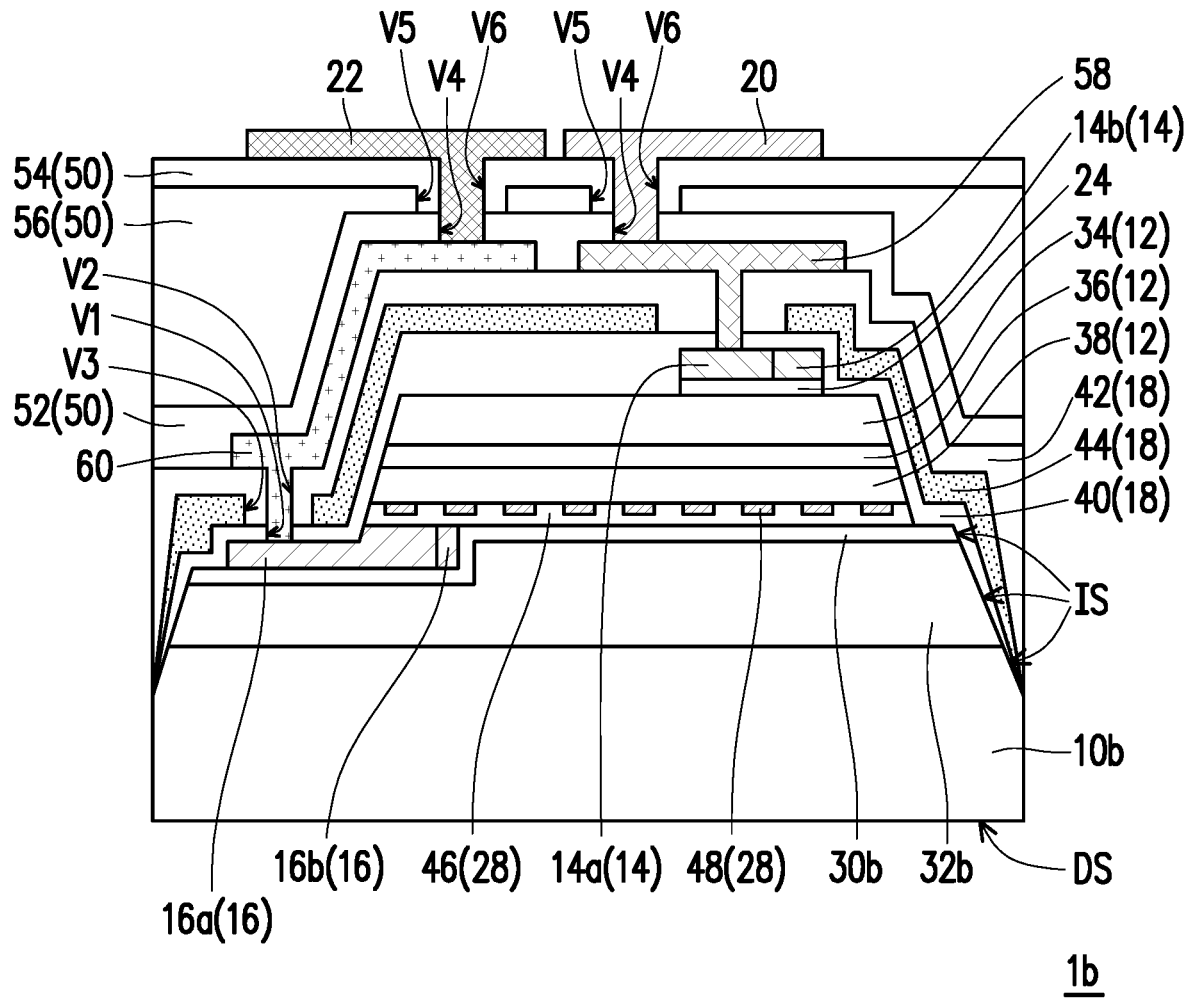

With reference to FIG. 7E, the first electrode pad 20 and the second electrode pad 22 are formed on the third insulating layer 52, and portions of the vias V4 to V6 are filled with the first electrode pad 20 and the second electrode pad 22 respectively, so that the first electrode pad 20 and the second electrode pad 22 are electrically connected to the first and the second current conducting layers 58 and 60 respectively. Manufacturing of the red light emitting diode 1b is generally completed so far.

FIG. 8A to FIG. 8J are diagrams of a partial manufacturing process of manufacturing the red light emitting diode in FIG. 4A.

The manufacturing process of manufacturing the red light emitting diode 1c in FIG. 4A is generally similar to the manufacturing process of manufacturing the red light emitting diode 1 in FIG. 1. In continuation to FIG. 5D, with reference to FIG. 8A, one reflective layer 64 is formed on the insulating layer 30c.

Figure 8A:
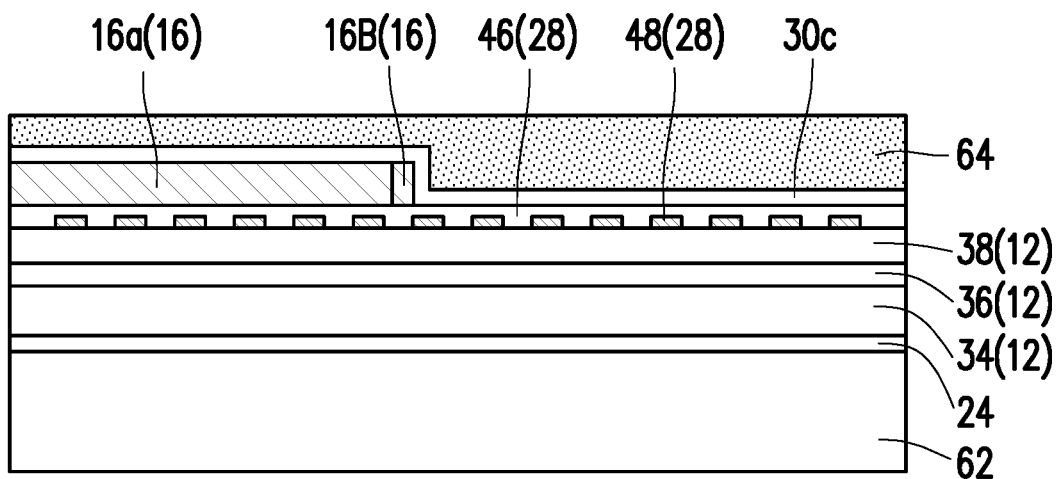
FIG. 8A to FIG. 8J are diagrams of a partial manufacturing process of manufacturing the red light emitting diode in FIG. 4A.
Figure 8B:
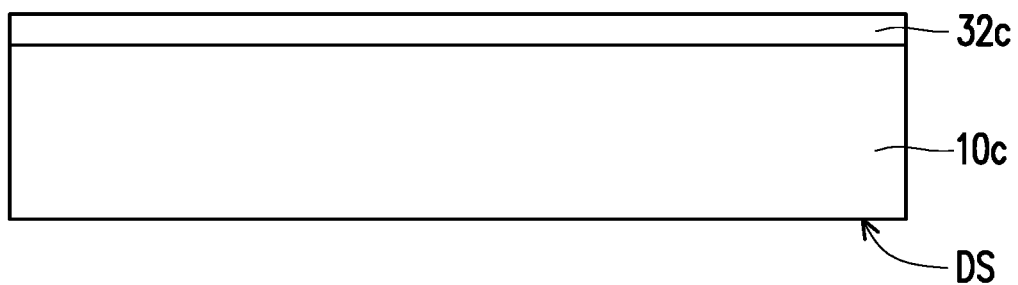

With reference to FIG. 8B, the step thereof is similar to that of FIG. 5E, and description is not repeated herein.

Figure 8C:
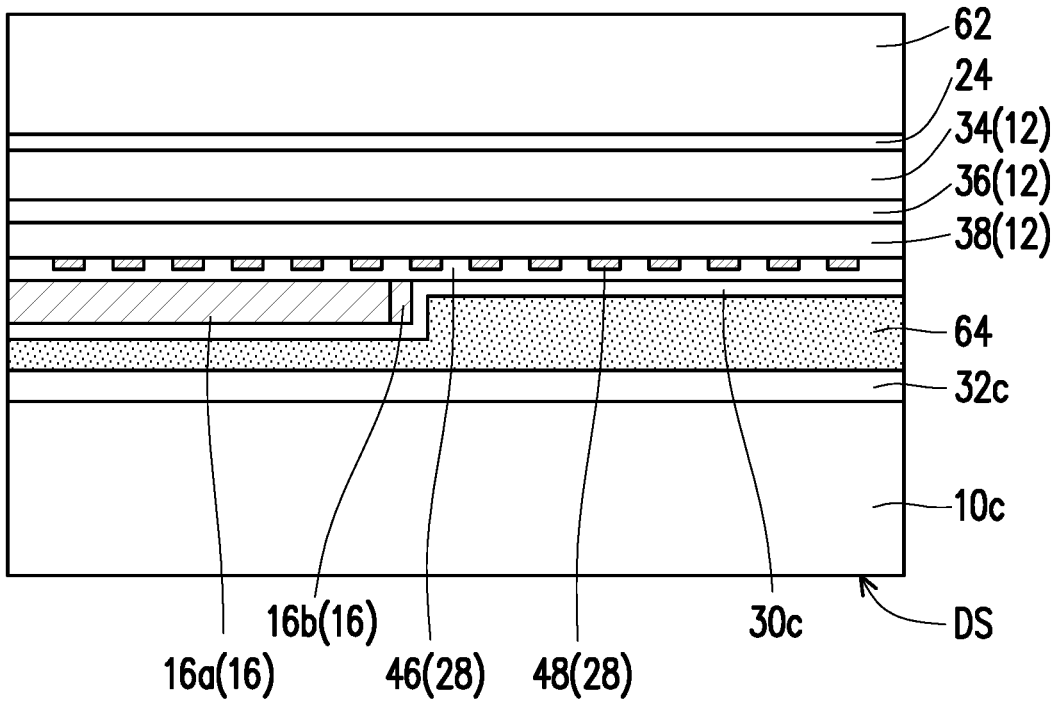
Figure 8D:
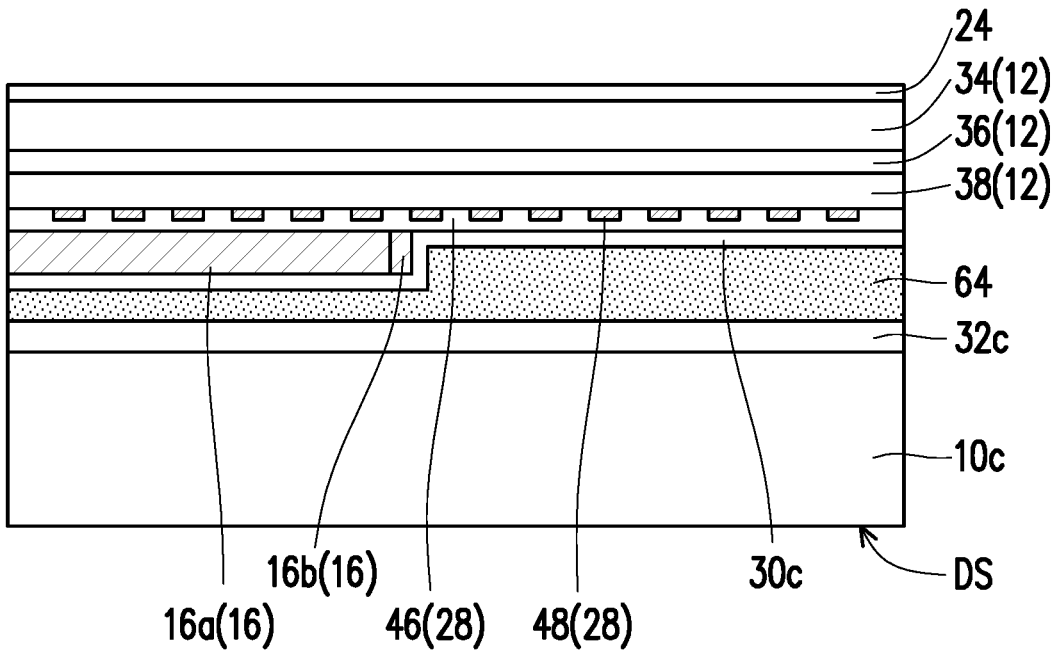
Figure 8E:
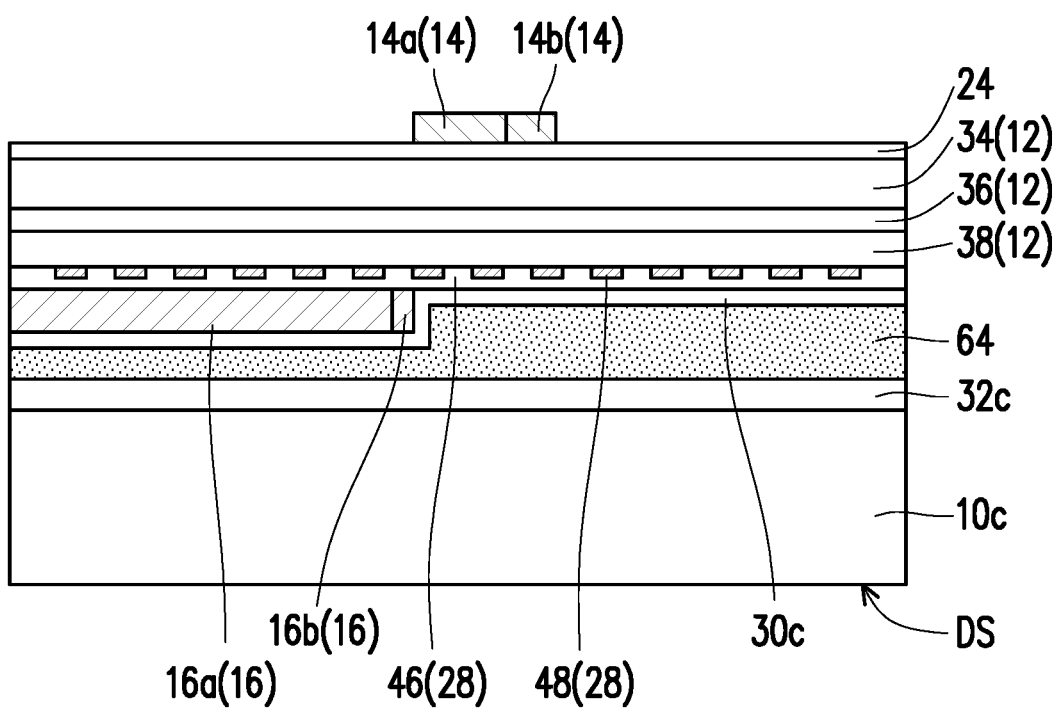
Figure 8F:
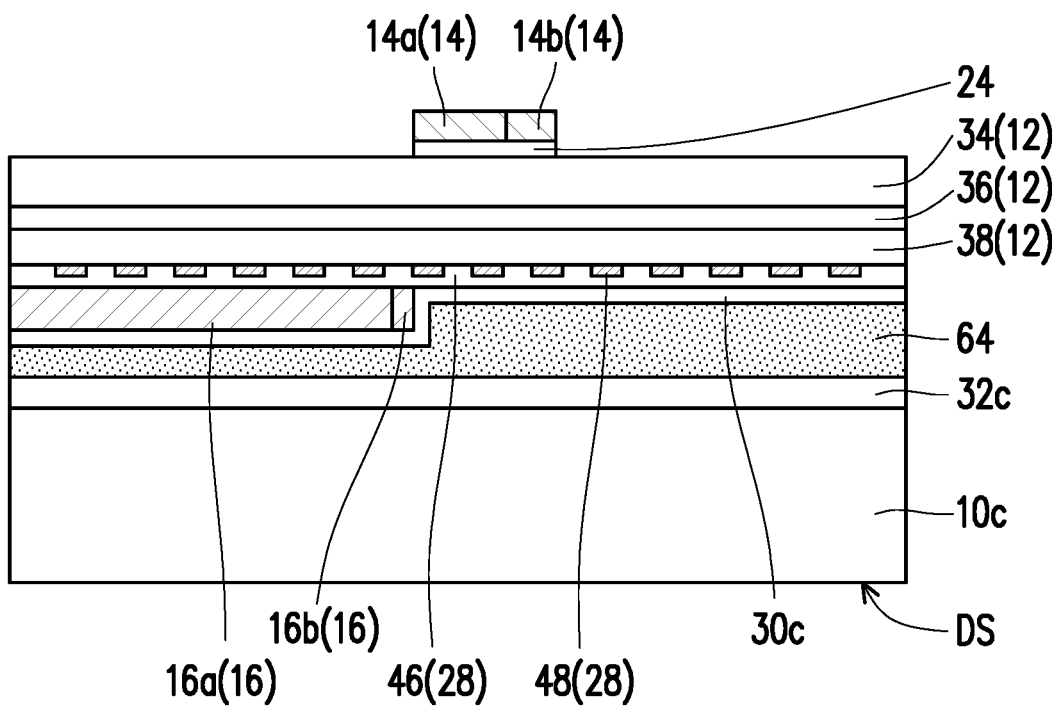
Figure 8G:
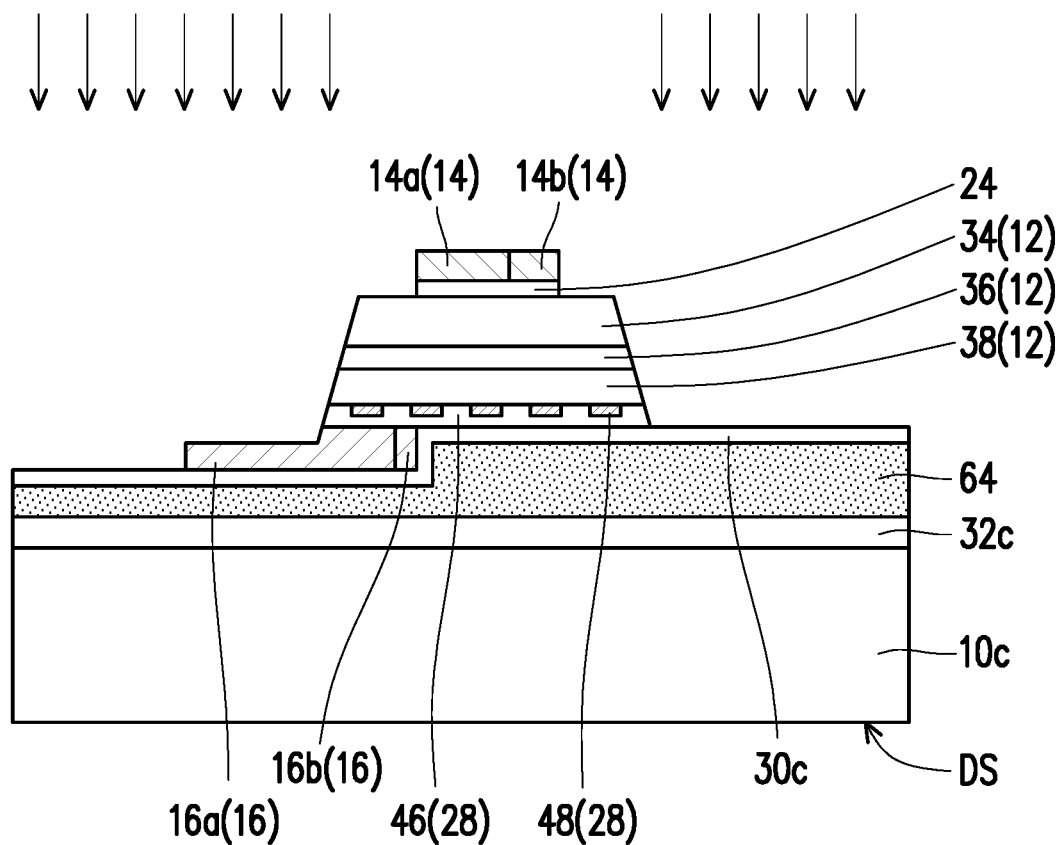

With reference to FIG. 8C, the structure in FIG. 8A is flipped, so that the reflective layer 64 is bonded onto the bonding layer 32, and that the epitaxial stacked layer 12 is bonded onto the substrate 10.

With reference to FIG. 8D to FIG. 8G, the steps thereof are similar to that of FIGS. 5G to 5J, and description is not repeated herein.

Figure 8H:
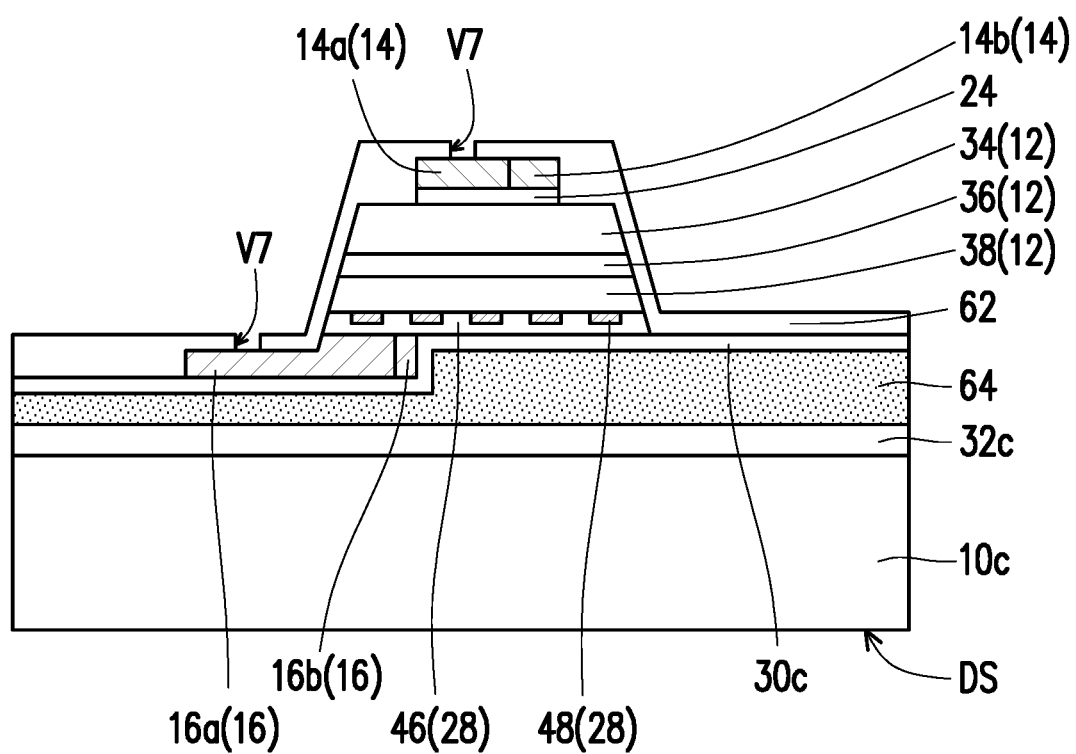

With reference to FIG. 8H, the upper insulating layer 62 is formed to cover the epitaxial stacked layer 12 and the first and the second electrodes 14 and 16, parts of the upper insulating layer 62 are etched to formed the plurality of vias V7, one part of the vias V7 expose the first electrode 14, and the other part of the vias V7 expose the second electrode 16.

Figure 8I:
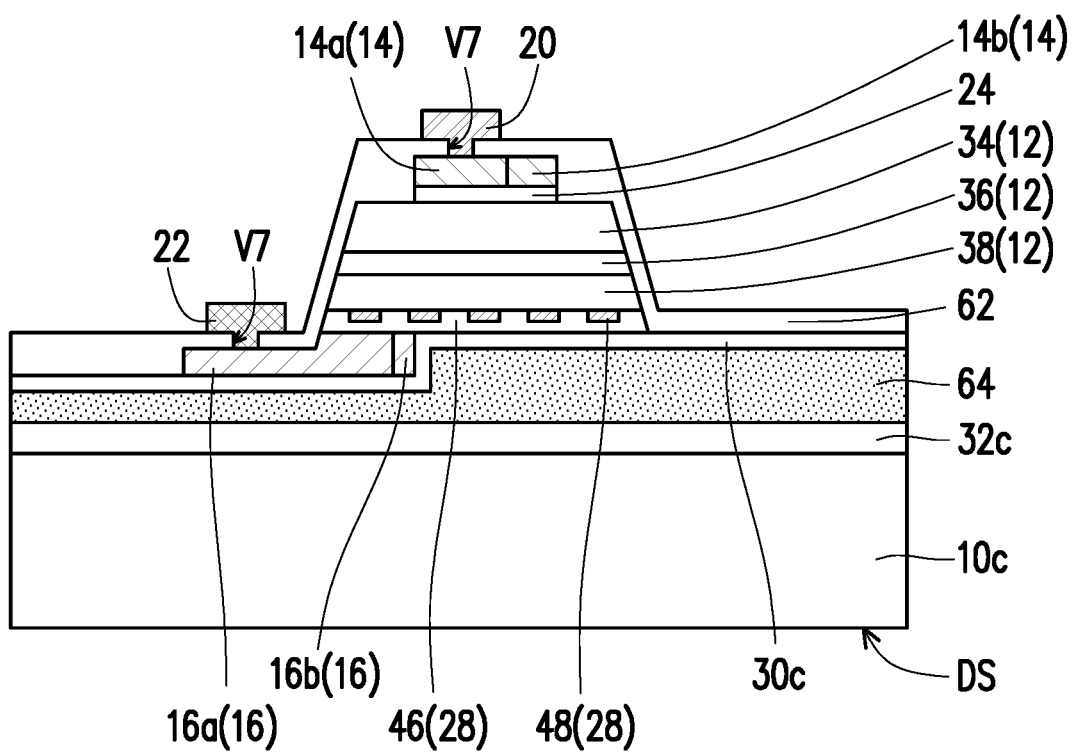

With reference to FIG. 8I, the first electrode pad 20 and the second electrode pad 22 are formed on the second insulating layer 42, and portions of the vias V7 are filled with the first electrode pad 20 and the second electrode pad 22 respectively, so that the first electrode pad 20 and the second electrode pad 22 are electrically connected to the first and the second electrodes 14 and 16 respectively.

Figure 8J:
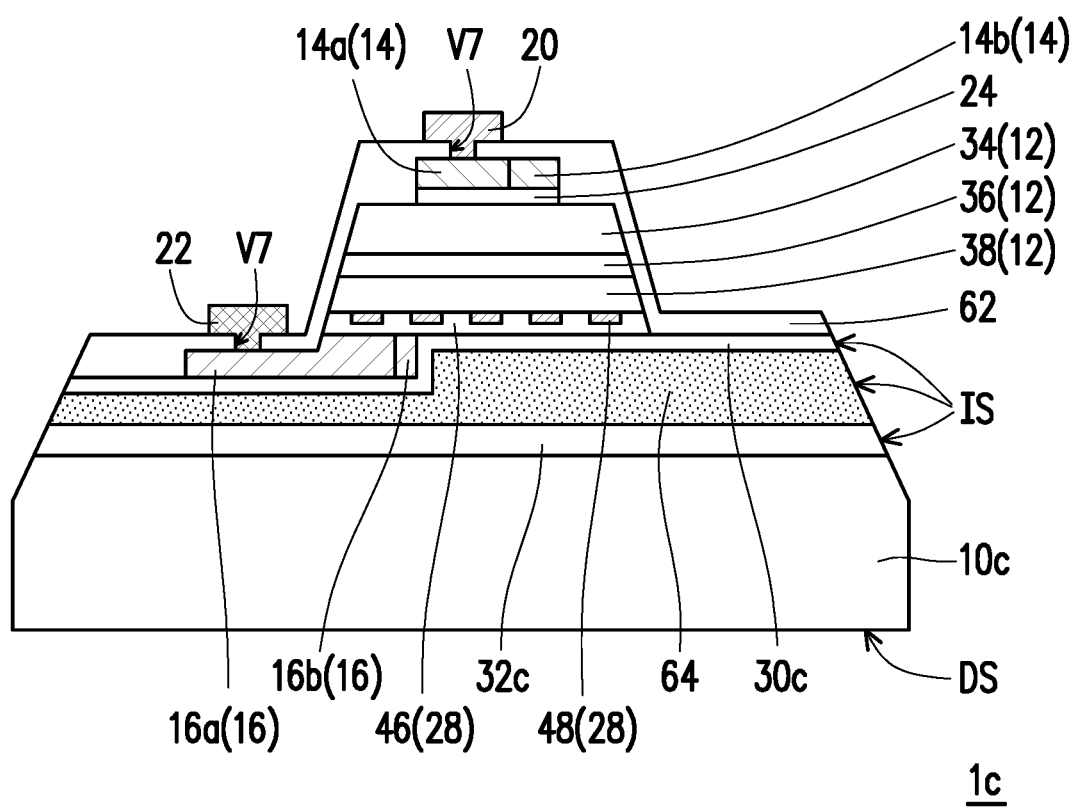

With reference to FIG. 8J, a cutting process is performed to cut the upper insulating layer 62, the lower insulating layer 30c, the reflective layer 64, the bonding layer 32c, and the substrate 10c, so that the side surfaces of the upper insulating layer 62, the lower insulating layer 30c, the reflective layer 64, the bonding layer 32c, and the substrate 10c form one inclined surface IS. Manufacturing of the red light emitting diode 1c is generally completed so far.

The manufacturing process of manufacturing the red light emitting diode 1d in FIG. 4C is generally identical to that of manufacturing the red light emitting diode 1c in FIG. 4A, and a main difference lies in that: the reflective layer 64 is not formed in FIG. 8A. The step of forming the inclined surface provided in FIG. 8J is then omitted.

In view of the foregoing, since the red light emitting diode of the disclosure is provided in a form of a flip-chip light emitting diode, the red light emitting diode may be electrically connected to an external substrate (e.g., an array substrate of a display) in a flip-chip manner through the two electrode pads and may not have to include a substrate and a bonding layer. In this way, arrangement of a wire-bonding region may be omitted, so that a volume of a light emitting diode device (e.g., a light emitting diode display) and a chip thickness may be effectively reduced, favorable applicability is provided, and applications to a micro LED light emitting module may be effectively applied. Besides, since the red light emitting diode is a flip-chip light emitting diode, heat dissipation may be performed through the internal first and second electrodes and the first and the second electrode pads to dissipate heat to the outside, and that heat dissipation efficiency is improved. In addition, the manufacturing method of manufacturing the red light emitting diode is also provided in the disclosure.

What is claimed is:

1. A red light emitting diode, comprising:
    an epitaxial stacked layer, comprising a first-type semiconductor layer, a second-type semiconductor layer, and a light emitting layer located between the first-type semiconductor layer and the second-type semiconductor layer, a main light emitting wavelength of the light emitting layer falling in a red light range, the epitaxial stacked layer comprising a first side and a second side opposite to each other, wherein the first side is adjacent to the first-type semiconductor layer, and the second side is adjacent to the second-type semiconductor layer;
    a first electrode, electrically connected to the first-type semiconductor layer and located at the first side of the epitaxial stacked layer;
    a second electrode, electrically connected to the second-type semiconductor layer and located at the second side of the epitaxial stacked layer;
    a first electrode pad, disposed on the first electrode and electrically connected to the first electrode;
    a second electrode pad, disposed on the second electrode and electrically connected to the second electrode, wherein the first electrode pad and the second electrode pad are located at the first side of the epitaxial stacked layer; and
    a reflective stacked layer, comprising a first insulating layer, a second insulating layer, and a reflective layer, the reflective layer disposed between the first insulating layer and the second insulating layer,
    wherein,
    the first insulating layer covers the epitaxial stacked layer and is located between the reflective layer and the epitaxial stacked layer, the first insulating layer has a plurality of first vias, and the first vias expose the first electrode and the second electrode;
    the second insulating layer covers the reflective layer and has a plurality of second vias; and
    the reflective layer has a plurality of third vias,
    wherein the first electrode pad and the second electrode pad are electrically connected to the first electrode and the second electrode respectively through the first vias, the second vias, and the third vias.

2. The red light emitting diode according to claim 1, further comprising:
    a buffer stacked layer, the reflective stacked layer located between the epitaxial stacked layer and the buffer stacked layer, the buffer stacked layer comprising a third insulating layer, a fourth insulating layer, and a buffer layer, the buffer layer sandwiched between the third insulating layer and the fourth insulating layer,
    wherein the third insulating layer covers the buffer layer, wherein the third insulating layer has a plurality of fourth vias, the buffer layer has a plurality of fifth vias, and the fourth insulating layer has a plurality of sixth vias;
    a first current conducting layer, disposed between the reflective stacked layer and the buffer stacked layer; and
    a second current conducting layer, disposed between the reflective stacked layer and the buffer stacked layer,
    wherein,
    the first current conducting layer and the second current conducting layer are electrically connected to the first electrode and the second electrode respectively through the first vias, the second vias, and the third vias, and the first electrode pad and the second electrode pad are electrically connected to the first current conducting layer and the second current conducting layer respectively through the fourth vias, the fifth vias, and the sixth vias.

3. The red light emitting diode according to claim 1, wherein
    at least one of the first electrode and the second electrode has a soldering portion and at least one finger portion extending from the soldering portion, wherein the reflective layer and the soldering portion of the first electrode or the second electrode are disposed in a misaligned manner, and the finger portion of the first electrode or the second electrode and the reflective layer are disposed in an overlapping manner.

4. The red light emitting diode according to claim 1, further comprising:
a carrying substrate, having an upper surface;
a bonding layer, disposed on the upper surface; and
a lower insulating layer, disposed on the upper surface, the bonding layer located between the carrying substrate and the lower insulating layer,
wherein,
the epitaxial stacked layer, the first electrode, the second electrode, the first electrode pad, and the second electrode pad are located on the lower insulating layer.

5. The red light emitting diode according to claim 4, wherein side surfaces of the carrying substrate, the bonding layer, and the lower insulating layer form an inclined surface.

6. The red light emitting diode according to claim 4, further comprising:
a third insulating layer;
a first current conducting layer, disposed between the reflective stacked layer and the third insulating layer; and
a second current conducting layer, disposed between the reflective stacked layer and the third insulating layer,
wherein the first electrode pad and the second electrode pad are electrically connected to the first electrode and the second electrode through the first current conducting layer and the second current conducting layer respectively.

7. The red light emitting diode according to claim 4, further comprising:
a buffer layer;
a first current conducting layer, disposed between the reflective stacked layer and the buffer layer; and
a second current conducting layer, disposed between the reflective stacked layer and the buffer layer,
wherein the first electrode pad and the second electrode pad are electrically connected to the first electrode and the second electrode through the first current conducting layer and the second current conducting layer respectively.

8. The red light emitting diode according to claim 1, further comprising:
a semiconductor layer, located between the first electrode and the first-type semiconductor layer, wherein the first electrode is electrically connected to the first-type semiconductor layer through the semiconductor layer.

9. The red light emitting diode according to claim 1, further comprising a conductive structure layer, disposed at the second side and located between the second-type semiconductor layer and the second electrode.

10. The red light emitting diode according to claim 9, wherein the conductive structure layer comprises:
a transparent conductive layer; and
a plurality of ohmic metal structures, the ohmic metal structures located between transparent conductive layer and the second-type semiconductor layer, the transparent conductive layer covering the ohmic metal structures.

11. The red light emitting diode according to claim 9, wherein the conductive structure layer comprises a transparent conductive layer.

12. A manufacturing method of a red light emitting diode, comprising:
forming an epitaxial stacked layer, wherein the epitaxial stacked layer comprises a first-type semiconductor layer, a second-type semiconductor layer, and a light emitting layer located between the first-type semiconductor layer and the second-type semiconductor layer, and a main light emitting wavelength of the light emitting layer falls in a red light range, wherein the epitaxial stacked layer has a first side and a second side opposite to each other, the first side is adjacent to the first-type semiconductor layer, and the second side is adjacent to the second-type semiconductor layer;
respectively forming a first electrode and a second electrode on the first side and the second side of the epitaxial stacked layer, the first electrode and the second electrode electrically connected to the first-type semiconductor layer and the second-type semiconductor layer of the epitaxial stacked layer respectively;
forming a first electrode pad and a second electrode pad on the first side of the epitaxial stacked layer, the first electrode pad and the second electrode pad electrically connected to the first electrode and the second electrode respectively; and
forming a reflective stacked layer on the epitaxial stacked layer, wherein the reflective stacked layer comprises a first insulating layer, a reflective layer, and a second insulating layer, wherein the reflective layer is located between the first insulating layer and the second insulating layer,
wherein the step of forming the reflective stacked layer further comprising:
forming the first insulating layer on the epitaxial stacked layer, the first electrode, and the second electrode and etching parts of the first insulating layer to form a plurality of first vias, the first vias exposing parts of the first electrode and the second electrode;
forming the reflective layer on the first insulating layer and etching parts of the reflective layer to form a plurality of third vias, the third vias respectively aligning with the first vias; and
forming the second insulating layer on the reflective layer and etching parts of the second insulating layer to form a plurality of second vias, the second vias respectively aligning with the third vias.

13. The manufacturing method of the red light emitting diode according to claim 12, the step of forming the first electrode pad and the second electrode pad on the first side of the epitaxial stacked layer further comprising: filling the first vias, the second vias, and the third vias with the first electrode pad and the second electrode pad, so that the first electrode pad and the second electrode pad are electrically connected to the first electrode and the second electrode respectively.

14. The manufacturing method of the red light emitting diode according to claim 12, further comprising forming a first current conducting layer and a second current conducting layer on the third insulating layer and filling the first vias, the second vias, and the third vias with the first current conducting layer and the second current conducting layer, so that the first current conducting layer and the second current conducting layer are electrically connected to the first electrode and the second electrode respectively.

15. The manufacturing method of the red light emitting diode according to claim 14, further comprising: forming a buffer stacked layer on the epitaxial stacked layer, wherein the buffer stacked layer comprises a third insulating layer, a buffer layer, and a fourth insulating layer, wherein the buffer layer is located between the third insulating layer and the fourth insulating layer.

16. The manufacturing method of the red light emitting diode according to claim 15, the step of forming the buffer stacked layer further comprising:
- forming the third insulating layer on the epitaxial stacked layer, the first electrode, and the second electrode and etching parts of the third insulating layer to form a plurality of fourth vias, the fourth vias exposing pails of the first current conducting layer and the second current conducting layer;
- forming the buffer layer on the third insulating layer and etching parts of the buffer layer to form a plurality of fifth vias, the fifth vias respectively aligning with the fourth vias; and
- forming the fourth insulating layer on the buffer layer and etching parts of the fourth insulating layer to form a plurality of sixth vias, the sixth vias respectively aligning with the fifth vias.

17. The manufacturing method of the red light emitting diode according to claim 16, the step of forming the first electrode pad and the second electrode pad on the first side of the epitaxial stacked layer further comprising: filling the fourth vias, the fifth vias, and the sixth vias with the first electrode pad and the second electrode pad, so that the first electrode pad and the second electrode pad are electrically connected to the first current conducting layer and the second current conducting layer respectively.

* * * * *